US011462998B2

(12) United States Patent
Kwak et al.

(10) Patent No.: US 11,462,998 B2
(45) Date of Patent: Oct. 4, 2022

(54) APPARATUS FOR DETECTING FEEDBACK ON VOLTAGE SUPPLIED FROM ELECTRONIC DEVICE TO EXTERNAL DEVICE

(71) Applicant: Samsung Electronics Co., Ltd., Suwon-si (KR)

(72) Inventors: Myunghoon Kwak, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 281 days.

(21) Appl. No.: 16/870,057

(22) Filed: May 8, 2020

(65) Prior Publication Data
US 2020/0373834 A1   Nov. 26, 2020

(30) Foreign Application Priority Data

May 21, 2019   (KR) ........................ 10-2019-0059602

(51) Int. Cl.
*H02M 3/00*   (2006.01)
(52) U.S. Cl.
CPC .. *H02M 3/003* (2021.05); *H05K 2201/10189* (2013.01)
(58) Field of Classification Search
CPC .............................. H02M 3/003; H02M 7/003
See application file for complete search history.

(56) References Cited

U.S. PATENT DOCUMENTS

| 9,584,041 B2 | 2/2017 | Rokusek et al. | |
| 10,656,664 B1* | 5/2020 | Sato | ........................ H02M 7/10 |
| 2006/0055608 A1* | 3/2006 | Minemura | ............. H01Q 21/28 343/702 |
| 2013/0135905 A1 | 5/2013 | Yeh | |
| 2014/0043006 A1 | 2/2014 | Tan et al. | |
| 2015/0280457 A1 | 10/2015 | Jung et al. | |
| 2016/0357204 A1 | 12/2016 | Lu | |
| 2017/0054328 A1 | 2/2017 | Jung et al. | |
| 2017/0353113 A1 | 12/2017 | Ono | |
| 2018/0083470 A1 | 3/2018 | Aldehayyat et al. | |
| 2020/0304020 A1* | 9/2020 | Lu | ........................ H02M 3/155 |

FOREIGN PATENT DOCUMENTS

KR   10-2015-0089659 A   8/2015

OTHER PUBLICATIONS

International Search Report dated Aug. 11, 2020, issued in International Application No. PCT/KR2020/006066.

* cited by examiner

*Primary Examiner* — Peter M Novak
(74) *Attorney, Agent, or Firm* — Jefferson IP Law, LLP

(57) ABSTRACT

A structure for detecting feedback on a supply voltage when an electronic device supplies a power source to an external device connected to a connector and an operating method thereof are provided. The electronic device includes a power supply device, at least one connector for a connection with an external device, a power line wired between the power supply device and the connector, a feedback line brought into contact with the power line at a location adjacent to the connector between the power supply device and the connector, a voltage compensation circuit detecting feedback on a supply voltage supplied to an external device at the location adjacent to the connector using the feedback line, and a control circuit configured to control a compensation related to the supply voltage based on the detected feedback.

12 Claims, 10 Drawing Sheets

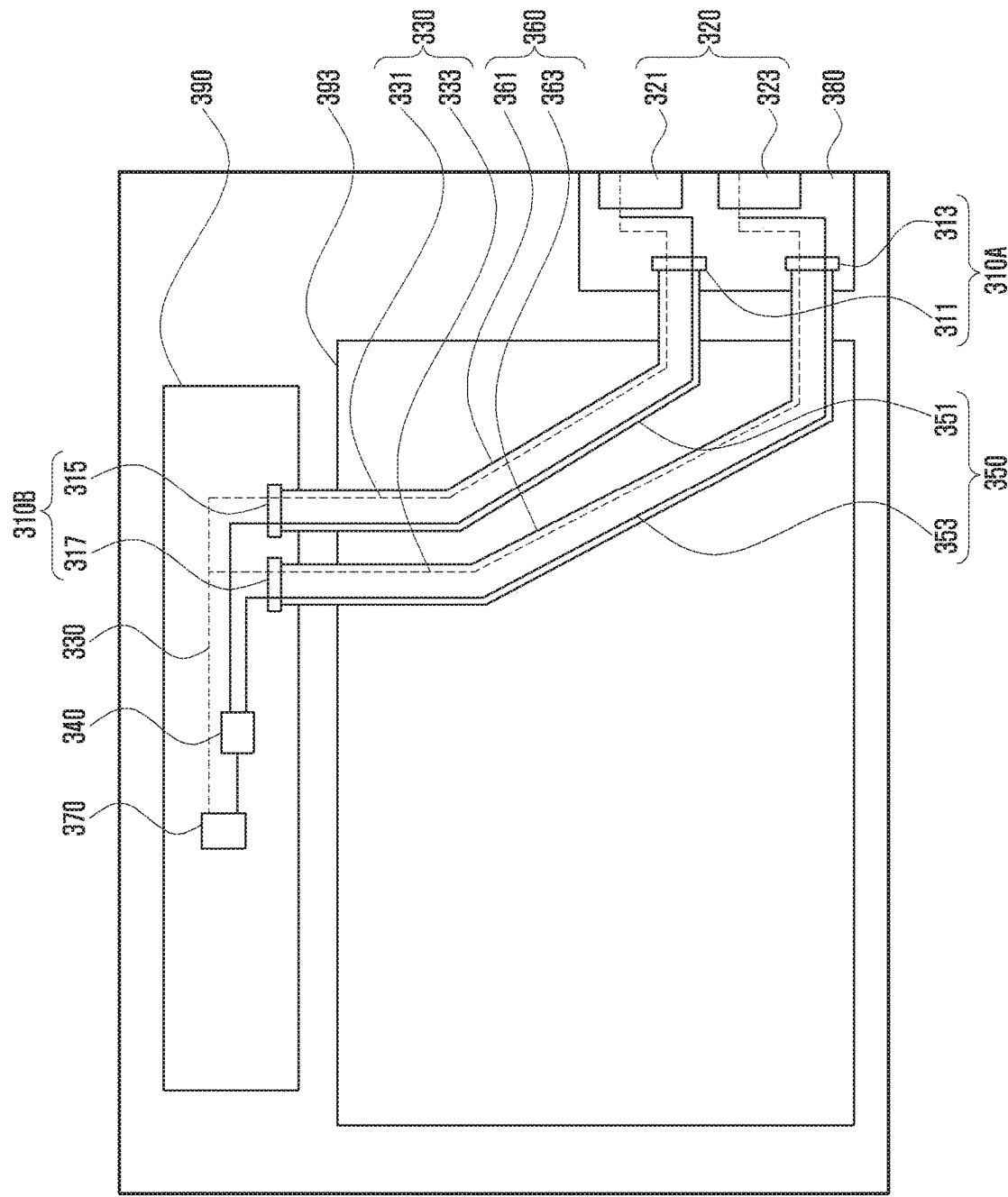

APPARATUS FOR DETECTING FEEDBACK ON VOLTAGE SUPPLIED FROM ELECTRONIC DEVICE TO EXTERNAL DEVICE

CROSS-REFERENCE TO RELATED APPLICATION(S)

This application is based on and claims priority under 35 U.S.C. § 119 of a Korean patent application number 10-2019-0059602, filed on May 21, 2019, in the Korean Intellectual Property Office, the disclosure of which is incorporated by reference herein in its entirety.

BACKGROUND

1. Field

The disclosure relates to a structure for detecting feedback on a supply voltage when a power source is supplied from an electronic device to an external device connected to a connector and an operating method thereof.

2. Description of Related Art

Recently various types of electronic devices such as a mobile communication terminal, a smartphone, a tablet personal computer (PC), a notebook, a wearable device, a smart glass (or head mounted display (HMD)) or a personal computer are widely used in line with the development of the digital technology. The electronic device may execute an application program using computing resources (e.g., processor and a memory) included in the electronic device, and may provide corresponding results (e.g., video and/or audio data) to a user.

The electronic device may include a power supply unit (PSU) for supplying a stable power source to a system (e.g., external device or electronic part within the electronic device).

The electronic device may include a connector for a connection with an external device, and may be supplied with a power source from the external device connected through the connector or may supply a power source to the external device using the PSU.

In order to detect feedback on a power source, the existing electronic device is implemented to detect the feedback by connecting the feedback line of the PSU to a power line close to the PSU among power lines from the PSU to the connector. For example, in the existing electronic device, a supply power source is compensated for by checking feedback in a distance relatively (or comparatively) close to the PSU. In the existing electronic device, however, feedback on a supply power source in a relatively long physical distance (e.g., a distance from the PSU to the connector for a connection with an external device) within the electronic device cannot be checked. Accordingly, a power drop is high in a relatively long distance compared to a relatively short distance, but the existing electronic device cannot detect the power drop and cannot provide an accurate compensation for the power drop.

In an electronic device, several external devices may be connected to one PSU through a connector. A power line may be connected from the PSU of the electronic device to a long distance (e.g., the connector). Accordingly, resistance in the power line may rise because the power line is connected up to a long distance within the electronic device.

If a supply current for an external device is increased, a power drop (or loss) may increase based on an increase in the supply current.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device can compensate for a power source supplied to an external electronic device and prevent a power loss by detecting feedback on a power source supplied from a power supply device to the outside and compensating for a supply power source based on a result of the detection.

Additional aspects will be set forth in part in the description which follows and, in part, will be apparent from the description, or may be learned by practice of the presented embodiments.

In accordance with an aspect of the disclosure, an electronic device is provided. The electronic device includes a power supply device, at least one connector to connect with an external device, a power line wired between the power supply device and the connector, a feedback line brought into contact with the power line at a location adjacent to the at least one connector between the power supply device and the connector, a voltage compensation circuit detecting feedback on a supply voltage supplied to an external device at the location adjacent to the at least one connector using the feedback line, and a control circuit configured to control a compensation related to the supply voltage based on the detected feedback.

In accordance with another aspect of the disclosure, an electronic device is provided. The electronic device includes a power supply device, at least one connector to connect with an external device, a power line wired between the power supply device and the at least one connector, a feedback line formed to come into contact with a power line at a location adjacent to the at least one connector, a voltage compensation circuit for detecting feedback on a supply voltage supplied to the external device, and a control circuit. The control circuit may be configured to determine a voltage output by the power supply device based on a signal related to the supply voltage of the voltage compensation circuit.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which:

FIG. 3A is a diagram schematically illustrating an example in which feedback lines are designed in an electronic device according to an embodiment of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to an electronic device and an operating method thereof according to various embodiments, there can be provided a structure for detecting feedback on a supply voltage when a power source is supplied from the electronic device to an external device connected to a connector and an operating method thereof. According to various embodiments, the electronic device can prevent a drop of a supply power source by switching the feedback line of a power supply device according to circumstances. According to various embodiments, in an electronic device, when one or more external devices are connected to a power supply device and a power source is supplied to the one or more external devices, a feedback line may be connected from a location closest to each of the external devices to the power supply device and feedback on a supply voltage for the external device may be detected. According to various embodiments, a feedback line may be connected between a location closest to an external device and a power supply device, voltages different depending on a load of the feedback line may be compared, a compensation voltage may be determined based on a result of the comparison, and an accurate voltage compensation may be provided. According to various embodiments, when one power supply device supplies a power source to a plurality of external devices, a power drop in each load can be properly compensated for.

Figure 1:
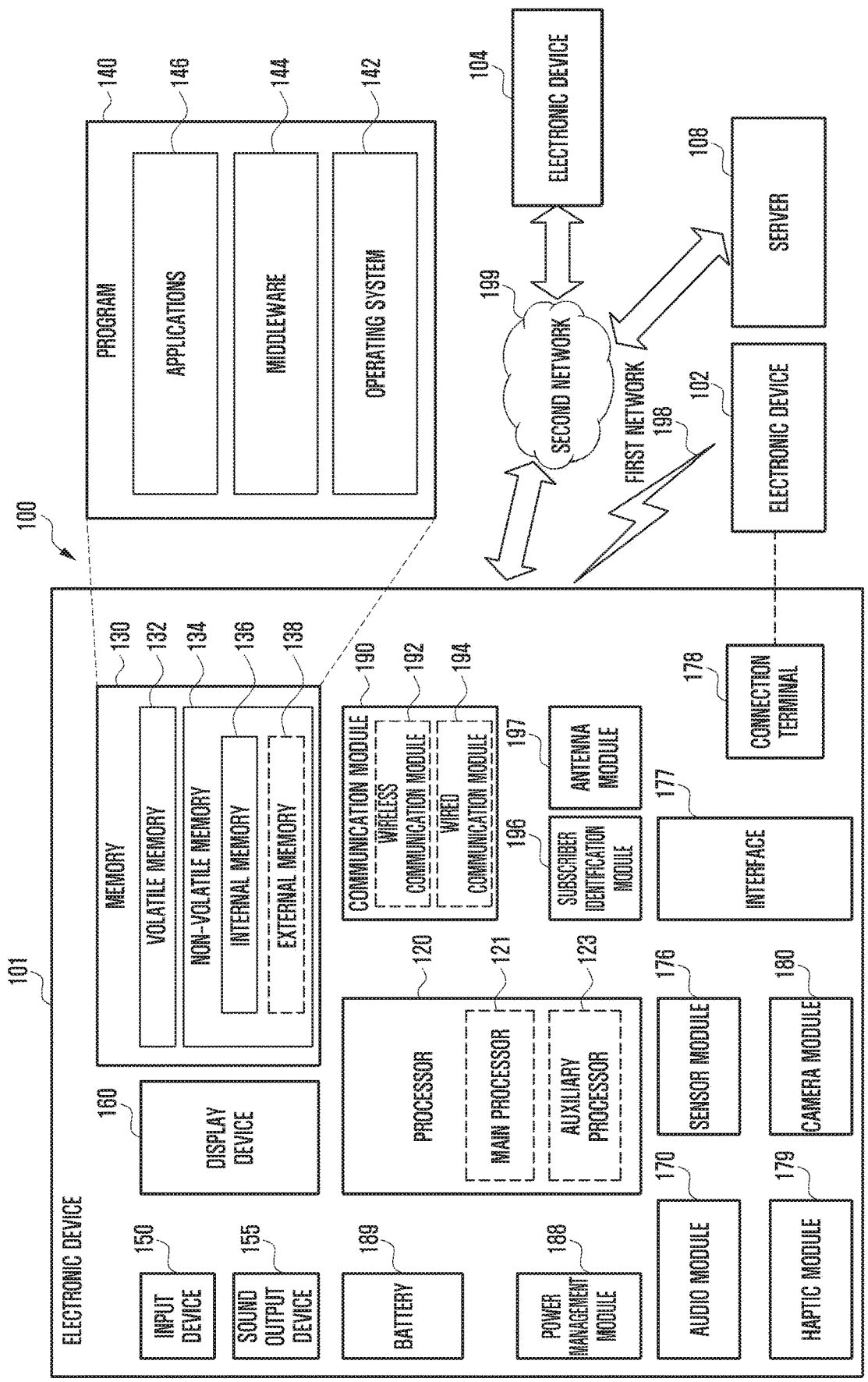
FIG. 1 illustrates an electronic device in a network environment according to an embodiment of the disclosure.

FIG. 1 illustrates an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), with an electronic device 104 or a server 108 via a second network 199 (e.g., a long-range wireless communication network), or with the electronic device 104 via the server 108, and may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. The processor 120 may load a command or data received from another component (e.g., the sensor module 176 or the communication module 190) in the volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101 and may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by another component (e.g., the processor 120) of the electronic device 101, from the outside (e.g., a user) of the electronic device 101, and may include a microphone, a mouse, a keyboard, or a digital pen (e.g., a stylus pen).

The sound output device 155 may output sound signals to the outside of the electronic device 101 and may include a speaker or a receiver. The speaker may be used for general purposes, such as playing multimedia or playing record, and the receiver may be used for incoming calls and may be implemented as separate from, or as part of the speaker.

The display device 160 may visually provide information to the outside (e.g., a user) of the electronic device 101 and may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa, and may obtain the sound via the input device 150, or output the sound via the sound output device 155 or a headphone of an external electronic device (e.g., an electronic device 102) directly (e.g., over wires) or wirelessly coupled with the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state, and may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., over wires) or wirelessly, and may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), and may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation, and may include a motor, a piezoelectric element, or an electric stimulator.

The camera module 180 may capture a still image or moving images and may include one or more lenses, image sensors, image signal processors, or flashes.

The power management module 188 may manage power supplied to the electronic device 101, and may be implemented as at least part of a power management integrated circuit (PMIC).

The battery 189 may supply power to at least one component of the electronic device 101, and may include a primary cell which is not rechargeable, a secondary cell which is rechargeable, or a fuel cell.

The communication module 190 (e.g., a transceiver) may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101 and may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., a radio-frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101.

All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing, as at least part of a reply to the request. To that end, a cloud, distributed, or client-server computing technology may be used, for example.

The electronic device 101 according to embodiments may be one of various types of electronic devices, such as a portable communication device (e.g., a smartphone), a computer device, a portable multimedia device, a portable medical device, a camera, a wearable device, or a home appliance. However, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., over wires), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
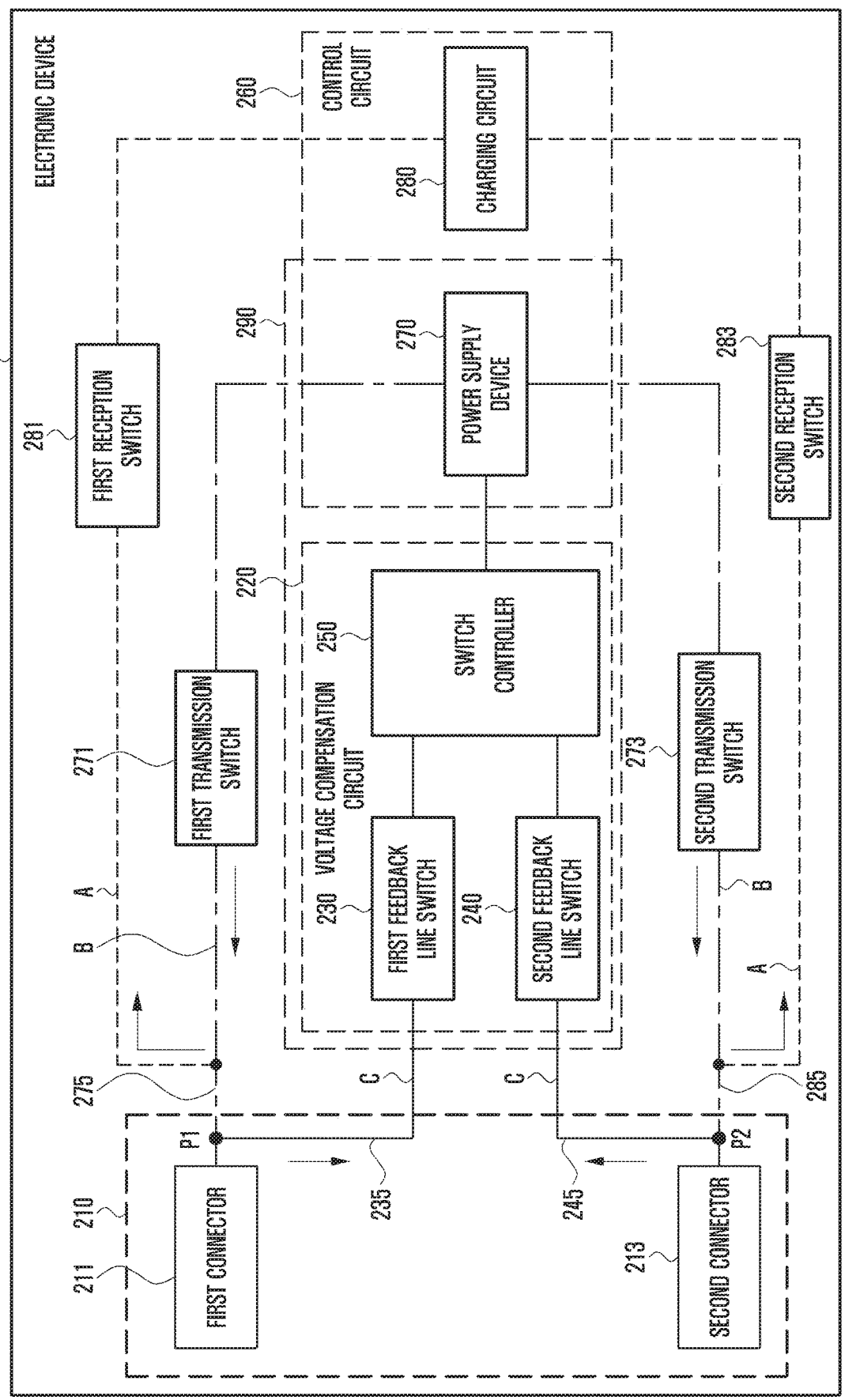
FIG. 2 is a diagram schematically illustrating an example of a block for describing an operation of a configuration for detecting feedback in an electronic device according to an embodiment of the disclosure.

FIG. 2 is a diagram schematically illustrating an example of a block for describing an operation of a configuration for detecting feedback in the electronic device 101 according to an embodiment of the disclosure.

Referring to FIG. 2, the electronic device 101 according to various embodiments may include a connector 210, a voltage compensation circuit 220 (or feedback control circuit or a feedback detection circuit), a control circuit 260, and a power switch (271, 273, 281, 283) (e.g., transmission switches 271 and 273 and/or reception switches 281 and 283).

In one embodiment, the connector 210 may be a terminal according to the universal serial bus (USB) standard. For example, the connector 210 may be a USB connector, such as USB Type A, B or C. The connector 210 may be an interface for USB charging and/or power supply (e.g., on the go (OTG)) to an external device. According to one embodiment, the connector 210 may be connected to an external device (not illustrated). For example, the connector 210 may illustrate a connection terminal (e.g., the connection terminal 178 in FIG. 1) capable of exchanging data using a wired method (or wire (or direct) connection) based on a cable, such as a USB. According to one embodiment, the electronic device 101 includes at least one connector 210. FIG. 2 may illustrate an example in which the electronic device 101 includes two connectors, that is, a first connector 211 and a second connector 213. Various embodiments are not limited to the example. The electronic device 101 may be configured to include one connector 210 or at least two connectors.

In one embodiment, FIG. 2 may illustrate an example of the electronic device 101 in which the connector 210 for a connection with an external device includes at least two connectors (e.g., the first connector 211 and the second connector 213) and at least two external devices may be connected to the electronic device 101 through the least two connectors 210.

In one embodiment, the external device may include various devices which may be connected to the electronic device 101 through the connector 210 of the electronic device 101. For example, the external device may include an external power device, such as a power adaptor (e.g., common power adaptor or high voltage power adaptor (or high speed charger)), or a power consumption device, such as a USB device (e.g., mouse, keyboard, memory, printer, camera or storage device (e.g., external hard, CF card or SD card)). In one embodiment, the external device may include an OTG device (e.g., OTG converter or OTG cable). According to one embodiment, the external device may be connected to the connector 210 of the electronic device 101 through an OTG device or may be directly connected to the connector 210.

According to one embodiment, if an external device (e.g., external power device) for supplying a power source is connected to the connector 210, the electronic device 101 may be supplied with (or receive) a power source from the external device. For example, the external device is a device which may be functionally connected to the electronic device 101, and may be a power adaptor. According to one embodiment, if an external device (e.g., power consumption device) that consumes a power source is connected to the connector 210, the electronic device 101 may convert the battery voltage of the battery (e.g., the battery 189 in FIG. 1) of the electronic device 101 into an operating voltage of the external device through a power supply device 270, and may provide (or transmit) the converted voltage to the external device. For example, the external device is a device which may be functionally connected to the electronic device 101, and may be a power consumption device (or external power receiver) (e.g., OTG device) for receiving a power source (or power) from the electronic device 101. The OTG device may operate using the battery voltage of the electronic device 101. According to one embodiment, the control circuit 260 may supply the battery voltage to the external device in a direction opposite a charging direction (i.e., direction opposite a current direction upon charging).

In one embodiment, the voltage compensation circuit 220 may illustrate a circuit for identifying a power drop by detecting feedback on a given voltage (e.g., supply voltage) when the given voltage is supplied to an external device through the power supply device 270 and compensating for a voltage based on the power drop. According to one embodiment, the voltage compensation circuit 220 may include a first feedback line switch 230, a second feedback line switch, and a switch controller 250 (or feedback switch).

The first feedback line switch 230 according to one embodiment may be a switch capable of switching (e.g., on/off (or close/open) the connection of a first feedback line 235 in a first power line 275 (e.g., a line in a reception path A or a line in a transmission path B). For example, the first feedback line switch 230 may be a switch for connecting the first feedback line 235 (e.g., connecting a feedback path C) in order to detect feedback associated with a voltage supplied to an external device connected to the first connector 211 in the first power line 275 in a transmission mode (or Tx mode) or for releasing (or off) the connection of the first feedback line 235 (e.g., releasing the connection of the feedback path C) in a reception mode (or Rx mode).

The second feedback line switch 240 according to one embodiment may be a switch capable of switching (e.g., on/off (or open/close) the connection of a second feedback line 245 in a second power line 285 (e.g., the line in the reception path A or the line in the transmission path B). For example, the second feedback line switch 240 may be a switch for connecting the second feedback line 245 (e.g., connecting the feedback path C) in order to detect feedback associated with a voltage supplied to an external device connected to the second connector 213 in the second power line 285 in the transmission mode (or Tx mode) or for releasing (or off) the connection of the second feedback line 245 (e.g., releasing the connection of the feedback path C) in the reception mode (or Rx mode).

In one embodiment, each of the first feedback line switch 230 and the second feedback line switch 240 may include a switch for the connection or blocking (or connection release) of the feedback path C between the power supply device 270 and an external device connected through the connector 210. For example, each of the first feedback line switch 230 and the second feedback line switch 240 may include a metal oxide semiconductor field effect transistor (MOSFET) switch, but is not limited thereto and may be implemented by various switches (e.g., metal-semiconductor field-effect transistor (MESFET) switch or metal-insulator-semiconductor field-effect transistor (MISFET) switch).

In one embodiment, in the example of FIG. 2, the reception path A and transmission path B according to each of the power lines 275 and 285 have been divided and illustrated, for convenience of description, but the transmission path and reception path in each of the power lines 275 and 285 may be implemented as a single line. For example, each of the first power line 275 and the second power line 285 may be designed as a power line for a contact point so that bi-directional communication (or transmission and reception) is possible through a single power line.

The switch controller 250 according to one embodiment may be a circuit capable of controlling (e.g., on/off (or open/close) the switching (or connection) of the first feedback line switch 230 and/or the second feedback line switch 240.

According to various embodiments, a feedback line (e.g., the first feedback line 235 or the second feedback line 245) may be a power detection line for detecting feedback associated with a power source supplied to an external device at the end (e.g., location closest to the connector 210) of a power line (e.g., the first power line 275 or the second power line 285) connected to the connector 210 (e.g., the first connector 211 or the second connector 213) in the Tx mode in which a power source is supplied from the power supply device 270 to the external device. According to one embodiment, the feedback line 235 or 245 may be connected to the power supply device 270 for feedback in the Tx mode, and the connection of the feedback line 235 or 245 with the power supply device 270 may be released in the Rx mode.

For example, the feedback lines 235 and 245 may include feedback line switches (e.g., the first feedback line switch 230 and the second feedback line switch 240). When a power source is supplied from the power supply device 270 to an external device connected to the connector 210 in the Tx mode, each of the feedback lines 235 and 245 may form (or connect) a feedback path to the power supply device 270 by making on (or closing) each of the feedback line switches 230 and 240. For example, each of the feedback lines 235 and 245 may make on (or close) each of the feedback line switches 230 and 240 of the feedback lines 235 and 245 when operating in the Tx mode in the path in which an external device has been connected, and may make off (or open) each of the feedback line switches 230 and 240 of the feedback lines 235 and 245 when operating in the Rx mode in the path in which an external device has been connected.

According to various embodiments, each of the feedback lines 235 and 245 may be brought into contact at each of the power lines 275 and 285 (e.g., an end connected to the connector 210, for example, each of locations P1 and P2 closest to the connector 210). For example, in various embodiments, the feedback lines 235 and 245 may be configured at the end parts of the connector 210 to which the power lines 275 and 285 are connected, and may be connected to the voltage compensation circuit 220. According to one embodiment, the electronic device 101 may identify a voltage drop of a voltage supplied to an external device connected to the connector 210 by detecting feedback on the voltage supplied to the external device at the end part of the connector 210 using the voltage compensation circuit 220, and may determine at least one external device or connector in which the voltage drop occurs. According to one embodiment, the electronic device 101 may identify a voltage drop of a voltage supplied to a plurality of external devices connected to the connector 210 by detecting feedback at the end part of the connector 210 using the voltage compensation circuit 220, and may determine an external device in which a great voltage drop occurs among the plurality of external devices.

In one embodiment, the electronic device 101 (e.g., the switch controller 250 or the power supply device 270) may determine a compensation value (or compensation voltage) for compensating for a voltage drop for an external device based on a degree of the voltage drop, and may compensate for the voltage drop by compensating for (e.g., boosting) a supply voltage based on the determined compensation value. In one embodiment, when a difference between the voltage drops of a plurality of external devices is great, the electronic device 101 (e.g., the switch controller 250 or the power supply device 270) may determine a compensation value based on an external device having a smaller voltage drop (or supply voltage for an external device). According to one embodiment, the electronic device 101 (e.g., the switch controller 450) may identify feedback on a boosted voltage by a compensation value, may drop the compensation value to a proper value when the boosted voltage (e.g., compensated voltage) is higher than the reference voltage (or given voltage) of a supply voltage for an external device, and may provide the proper voltage.

According to one embodiment, at least some of the functions of the voltage compensation circuit 220 (e.g., the switch controller 250) may be performed by another control circuit (e.g., the processor 120 in FIG. 1 or the control circuit 260 (e.g., the power supply device 270 or the charging circuit 280)).

In one embodiment, FIG. 2 illustrates an example in which the voltage compensation circuit 220 has been configured independently of a control circuit (e.g., the power supply device 270), but various embodiments are not limited thereto. Various design changes are possible. For example, as illustrated as an element 290, at least some (e.g., the switch controller 250) of or the entire voltage compensation circuit 220 may be configured to be included in the power supply device 270.

In one embodiment, FIG. 2 illustrates two feedback line switches (i.e., the first feedback line switch 230 and the second feedback line switch 240) in accordance with the first connector 211 and the first power line 275 connected to the first connector 211, and the second connector 213 and the second power line 285 connected to the second connector 213, but various embodiments are not limited thereto. Various design changes are possible. For example, if the electronic device 101 includes one connector and one power line connected to the one connector, the electronic device 101 may be configured to include one feedback line coming into contact with the one power line and one feedback line switch for switching the connection of the one feedback line.

In one embodiment, the control circuit 260 (e.g., the power management module 188 in FIG. 1) may manage power supplied to the electronic device 101 and/or an external device, and may manage power received from the external device. For example, the control circuit 260 may have a charger function for charging a battery (e.g., the battery 189 in FIG. 1) with an input power source from an external device, a function for communication (e.g., USB battery charging communication, USB power delivery (PD) communication, adaptive fast charging (AFC) communication and/or quick charge (QC) communication) with an external device (e.g., external power device) connected to the connector 210 (e.g., the first connector 211 and/or the second connector 213), a function for supplying necessary power to a system (or electronic part) and supplying a power source suitable for a voltage level necessary for each electronic part and/or a function for supplying power to an external device in a power Tx mode. According to one embodiment, the control circuit 260 may include the power supply device 270 and a charging circuit 280.

The power supply device 270 according to one embodiment may be a device (e.g., power supply unit (PSU)) for supplying a stable power source to an external device connected through the connector 210. The power supply device 270 may function to supply a power source (e.g., given voltage) suitable for each external device so that the power source supplied from the electronic device 101 to the external device can be stably used in the external device, for example. According to one embodiment, the power supply device 270 may adjust a voltage to a required level while forming (or connecting) or releasing (or blocking) a path for power supply using a switch (e.g., the first transmission switch 271 or the second transmission switch 273). For example, the power supply device 270 may supply a power source to an external device connected to the first connector 211 based on the on/off (or open/close) of the first transmission switch 271 between the first connector 211 and the power supply device 270. For another example, the power supply device 270 may supply a power source to an external device connected to the second connector 213 based on the on/off (or open/close) of the second transmission switch 273 between the second connector 213 and the power supply device 270. The power supply device 270 according to one embodiment may function to constantly maintain a current by controlling power supplied to an external device, for example. For example, when a drop of a supply voltage supplied to an external device occurs, the power supply device 270 may supply a power source (e.g., given voltage) to the external device based on a voltage (e.g., boosted voltage) compensated based on a voltage compensation.

According to one embodiment, the first transmission switch 271 and the second transmission switch 273 may include a switch for the connection or blocking of the transmission path B between the power supply device 270 and an external device connected through the connector 210. For example, each of the first transmission switch 271 and the second transmission switch 273 may include an MOSFET switch, but is not limited thereto. Each of the first transmission switch 271 and the second transmission switch 273 may be implemented by various switches (e.g., MESFET switch or MISFET switch).

The charging circuit 280 according to one embodiment may charge the battery (e.g., the battery 189 in FIG. 1) of the electronic device 101 using power supplied from an external device with respect to the electronic device 101. According to one embodiment, the charging circuit 280 may select a charging method (e.g., normal charge or quick charge) based on at least some of the type (e.g., power adaptor or USB charger) of an external device, the amount of power which may be supplied from an external device or the attributes of the battery, and may charge the battery using the selected charging method. According to one embodiment, the charging circuit 280 may adjust power of an external device or the battery to a voltage or current level suitable for each element of each of elements (or electronic part or system) included in the electronic device 101, and may output the adjusted voltage or current.

According to various embodiments, the control circuit 260 may determine a voltage compensation associated with an external device at least based on feedback (e.g., actual supply voltage) detected through the feedback lines 235 and 245 using the power supply device 270 and/or the charging circuit 280. For example, the control circuit 260 may form the contact points P1 and P2 with the power lines 275 and 285 at locations closest to the connector 210 to which an external device has been connected (e.g., the locations of the contact points P1 and P2 in FIG. 2), may detect feedback on a supply voltage supplied to the external device at the contact points P1 and P2 (e.g., locations closest to the connector 210) of the feedback lines 235 and 245, and may compare voltages different depending on a load of the detected feedback (e.g., a difference between a given voltage and an actual supply voltage). The control circuit 260 may determine a compensation voltage for the external device based on a result of the comparison. According to one embodiment, at least some of the functions of the control circuit 260 may be performed by an external controller (e.g., the processor 120 in FIG. 1, the switch controller 250 of the voltage compensation circuit 220 or the charging circuit 280).

Referring to FIG. 2, the electronic device 101 according to various embodiments may include one or more connectors 210 for a connection with an external device, and may be supplied with a power source from an external device connected through the connectors 210 or may supply a power source to an external device by the power supply device 270.

According to various embodiments, as illustrated in FIG. 2, in the electronic device 101, several external devices may be connected to one power supply device 270. A power line may be connected up to the inside of the electronic device 101 (e.g., from the power supply device 270 to a long distance (e.g., the connector 210 exposed to the outside of the electronic device 101). According to various embodiments, in the power line, the feedback lines 235 and 245 may be connected with the power supply device 270 from locations (e.g., the locations of the contact points P1 and P2) closest to the connector 210. A drop of a supply voltage for an external device can be prevented based on feedback using the feedback lines 235 and 245. According to various embodiments, if a plurality of external devices is connected through the first connector 211 and the second connector 213, the power supply device 270 may operate to compare voltages different depending on loads of the feedback lines 235 and 245, determine a voltage compensation for at least one external device, and supply a power source based on the determined compensation voltage. A voltage compensation circuit and an operation thereof according to various embodiments are described below.

FIG. 3A is a diagram schematically illustrating an example in which feedback lines are designed in the electronic device 101 according to an embodiment of the disclosure.

Figure 3B:
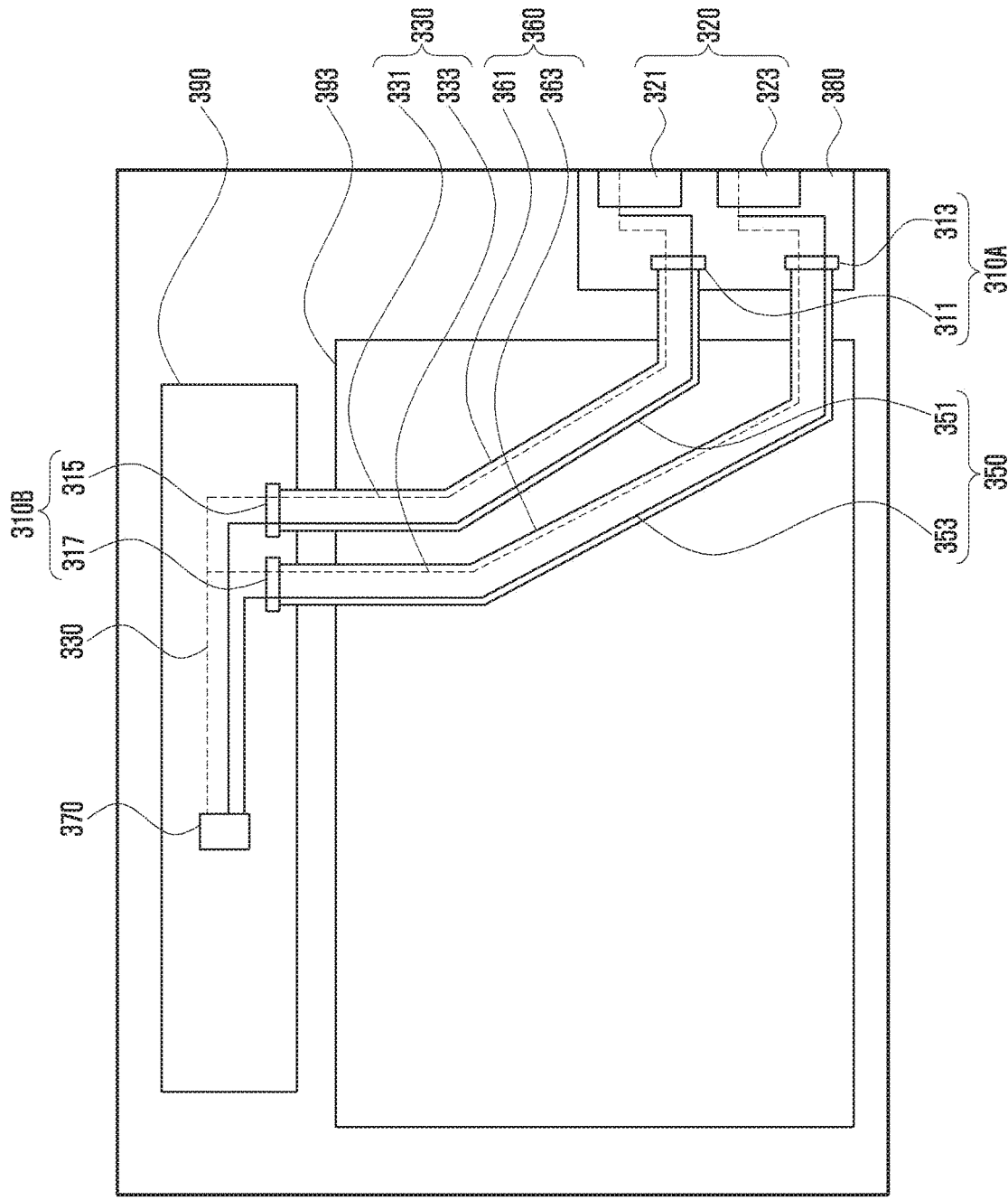
FIG. 3B is a diagram schematically illustrating another example in which feedback lines are designed in an electronic device according to an embodiment of the disclosure.

FIG. 3B is a diagram schematically illustrating another example in which feedback lines are designed in the electronic device 101 according to an embodiment of the disclosure.

Referring to FIGS. 3A and 3B, the same reference numeral may be used for similar or related elements.

FIGS. 3A and 3B may illustrate examples in which the electronic device 101 includes two outside connectors 320 (e.g., first outside connector 321 and second outside connector 323) for a connection with an external device. According to various embodiments, the electronic device 101 may include two pairs of inside connectors 310A and 310B (or two pairs of nodes) (e.g., the first connector 310A on the outside within the electronic device 101 and the second connector 310B on the inside within the electronic device 101) electrically connected to the two outside connectors 320 capable of being connected to an external device, respectively. For example, the two pairs of inside connectors 310A and 310B may be configured with two pairs of connectors (e.g., a pair of a connector 311 on the outside and a connector 315 on the inside and a pair of a connector 313 on the outside and a connector 317 on the inside, which are clustered). The two pairs of connectors may be formed on the outside (or on the outer side) (e.g., location adjacent to the outside connector 320) and on the inside (or on the inner side) (e.g., location adjacent to a power supply device 370), respectively. In one embodiment, the two pairs of connectors may be formed on both ends of a flexible printed circuit board (FPCB) 360 (e.g., a first FPCB 361 and a second FPCB 363), respectively. For example, one pair of connectors 311 and 315 may be formed at both ends of the first FPCB 361 and electrically connected. The other pair of connectors 313 and 317 may be formed at both ends of the second FPCB 363 and electrically connected.

According to various embodiments, the electronic device 101 may include a printed circuit board (PCB) in which various electronic parts are disposed, for supporting and electrically connecting (or coupling) the electronic parts. According to various embodiments, as schematically illustrated in FIGS. 3A and 3B, the electronic device 101 may include a first PCB 390 (e.g., main PCB), a battery 393 (or battery mounting space), and a second PCB 380 (e.g., connector PCB). In one embodiment, in FIGS. 3A and 3B, the second PCB 380 has been illustrated as being separated from the first PCB 390, but various embodiments are not limited thereto. The second PCB 380 may be formed as a structure included in (e.g., integrated into) the first PCB 390.

According to various embodiments, in the inside connectors 310A and 310B, the first connector 310A positioned at a location adjacent to the outside connector 320 may be electrically connected (or coupled) to the outside connector 320 through the second PCB 380 (e.g., connector PCB). The second connector 310B positioned at a location adjacent to the power supply device 370 may be electrically connected (or coupled) to the power supply device 370 through the first PCB 390 (e.g., main PCB). According to various embodiments, the FPCB 360 may function to electrically connect the second connector 310B of the first PCB 390 and the first connector 310A of the second PCB 380.

According to various embodiments, the FPCB 360 include (or may be wired to) a power line 330 and a feedback line 350. According to one embodiment, in the electronic device 101, the power line 330 and feedback line 350, having a long length and connected to the outside connector 320, may be wired through the inside connectors 310A and 310B and the FPCB 360. One end of the feedback line 350 may be brought into contact at a location closest to the outside connector 320 or the outside connector 320 in the power line 330. The other end of the feedback line 350 may be wired to be connected to the power supply device 370.

According to various embodiments, one power line 330 (e.g., a first power line 331 and a second power line 333) may be branched from the front end of the second connector 310B. The branched power lines 330 (e.g., the first power line 331 and the second power line 333) may be connected to the outside connector 320 through the first FPCB 361 and the second FPCB 363, respectively. For example, the electronic device 101 may include the power line 330 (e.g., the first power line 331 and the second power line 333), which has a long length and is extended from the power supply device 370 and connected to the outside connector 320 (e.g., the first outside connector 321 and the second outside connector 323).

According to various embodiments, as in the example of FIG. 3A, in the electronic device 101, the feedback line 350 (e.g., a first feedback line 351 and a second feedback line 353) may be extended from a voltage compensation circuit 340 through the inside connectors 310A and 310B and the FPCB 360, and may be wired (or connected) to come into contact with the outside connector 320 or the power line 330 at a location closest to the outside connector 320. According to various embodiments, in the electronic device 101, as in the example of FIG. 3B, the feedback line 350 may be extended from the power supply device 370, including the voltage compensation circuit 340, through the inside connectors 310A and 310B and the FPCB 360, and may be wired (or connected) to come into contact with the outside connector 320 or the power line 330 at a location closest to the outside connector 320.

According to various embodiments, the feedback line 350 (e.g., the first feedback line 351 and the second feedback line 353) may be connected (or come into contact with) the power line 330 at a location closest to each of the first outside connector 321 and the second outside connector 323 to which an external device is connected (e.g., the dead end (or end) of the outside connector 320 to which an external device is connected or a location closest to the outside connector 320 (e.g., an end toward the outside in the power line 330 or a location closest thereto). For example, in the electronic device 101, a contact point for detecting feedback may be formed at a location where a voltage (e.g., actual supply voltage) right before a voltage is transmitted to an external device may be detected in the feedback line for feedback on a voltage supplied to the external device.

According to various embodiments, the inside power line and the outside power line, and the inside feedback line and the outside feedback line have been illustrated based on the second connector 310B, but various embodiments are not limited thereto. For example, in various embodiments, the inside power line and the outside power line may be wired as a connected power supply line (or connected (or extended) from the power supply device 370 to the outside connector 320). In various embodiments, the inside feedback line and the outside feedback line may be wired as a connected power (or feedback) detection line (or connected (or extended) from the power supply device 370 to the outside connector 320).

According to various embodiments, the feedback line 350 for detecting feedback on a supply voltage supplied from the dead end of the outside connector 320 to an external device may be connected to the electronic device 101. According to various embodiments, the feedback line 350 may be brought into contact at one end of the power line 330 (e.g., one end connected to the outside connector 320, for example, a location closest to the outside connector 320). In various embodiments, the feedback line 350 may be configured at the dead end of the outside connector 320 to which the power line is connected, and may be connected to the voltage compensation circuit 340 (or the power supply device 370 including the voltage compensation circuit 340). According to various embodiments, the electronic device 101 may identify a more accurate voltage drop of a voltage supplied to an external device connected to the outside connector 320 by detecting feedback on the voltage supplied to the external device at the dead end of the outside connector 320 using the voltage compensation circuit 340 (or the power supply device 370 including the voltage compensation circuit 340).

According to various embodiments, the electronic device 101 is designed to check feedback at the end of the outside connector 320 or a location closest to the outside connector 320 based on the power line 330 having a relatively long physical distance (e.g., a distance from the power supply device 370 to the outside connector 320 for a connection with an external device) without checking the feedback at a distance relatively (or comparatively) close to the power supply device 370. Accordingly, a voltage compensation for a great voltage drop at a long physical distance can be accurately provided. According to one embodiment, the power line 330 may be wired from the power supply device 370 to the two power lines, and it may provide a power source to the plurality of outside connectors 320, may detect feedback on each of the outside connectors 320, and may provide a voltage compensation. According to one embodiment, the power line 330 may be wired from the power supply device 370 to one power line, and the one power line may be branched from the second connector 310B. Accordingly, the power line 330 may be wired to transmit a power source to the plurality of outside connectors 320, may detect feedback on each of the outside connectors 320, and may provide a voltage compensation. According to various embodiments, a voltage compensation can be provided when an external device is connected to the outside connector 320 (e.g., any one of the first outside connector 321 or the second outside connector 323) or an external device is connected to the outside connector 320 (e.g., each of the first outside connector 321 and the second outside connector 323) by one power source line.

Figure 4:
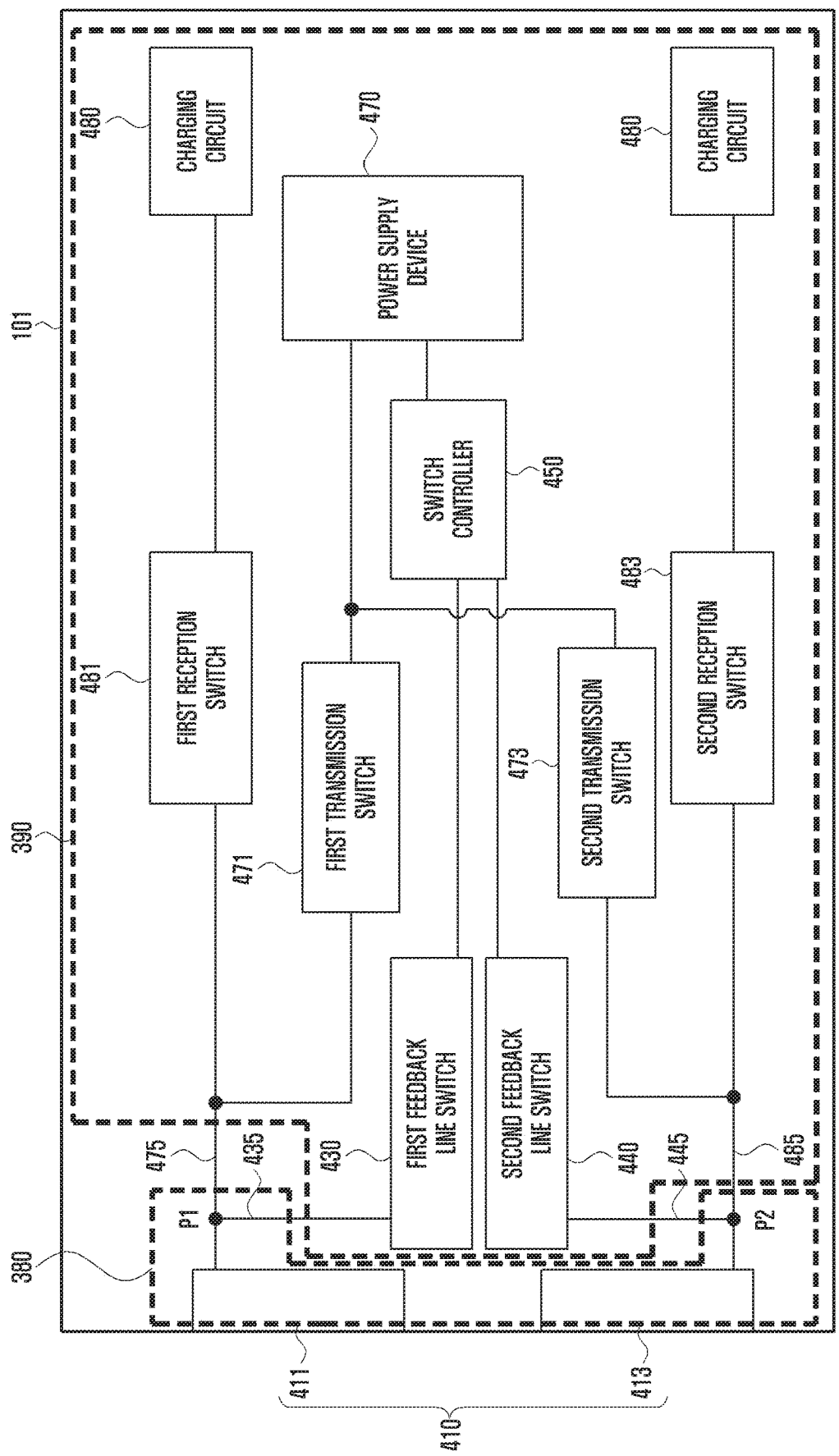
FIG. 4 is a diagram illustrating an example in which a voltage compensation circuit is configured in an electronic device according to an embodiment of the disclosure.

FIG. 4 is a diagram illustrating an example in which a voltage compensation circuit is configured in the electronic device 101 according to an embodiment of the disclosure.

Referring to FIG. 4, it may illustrate an example of a voltage compensation method using a voltage compensation circuit when one power supply device 470 supplies a power source to a plurality of external devices. For example, in FIG. 4, a first external device (not illustrated) and a second external device (not illustrated) may be connected to a connector 410 (e.g., a first connector 411 and a second connector 413). Each of the first external device and the second external device may be a power consumption device. According to one embodiment, the electronic device 101 may supply a power source to the first external device and the second external device through the power supply device 470. The voltage compensation circuit may detect feedback (e.g., first feedback or second feedback) on the supply voltage for each of the first external device and the second external device, and may compensate for a voltage.

According to one embodiment, elements (e.g., the connector 410, a voltage compensation circuit (e.g., a first feedback line switch 430, a second feedback line switch 440, and a switch controller 450), power switches 471, 473, 481, and 483, the power supply device 470, and charging circuits 480) illustrated in FIG. 4 may correspond to respective elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to FIG. 2, and a detailed description of contents similar to the aforementioned operation is omitted.

According to one embodiment, although schematically illustrated in FIG. 4, the connector 410 may be positioned in the second PCB 380 (e.g., connector PCB), such as that illustrated in FIG. 3A and/or FIG. 3B. One end of each of feedback lines 435 and 445 may come into contact with a power line in the connector 410 or at each of locations P1 and P2 closest to the connector 410 on the second PCB 380. The other end of each of the feedback lines 435 and 445 may be connected to the power supply device 470 through the voltage compensation circuit. For example, the contact point locations P1 and P2 of the feedback lines 435 and 445 for feedback detection may be designed to be closest to the connector 410. In one embodiment, the voltage compensation circuit (e.g., the first feedback line switch 430, the second feedback line switch 440, the switch controller 450), the power switch (e.g., the first transmission switch 471, the second transmission switch 473, the first reception switch 481, and the second reception switch 483), the power supply device 470, and the charging circuits 480 may be designed in the first PCB 390 (e.g., the main PCB), such as that illustrated in FIG. 3A and/or FIG. 3B.

Referring to FIG. 4, the electronic device 101 may include the voltage compensation circuit, including a feedback line switch (e.g., the first feedback line switch 430 and the second feedback line switch 440) capable of controlling the connection of the feedback lines 435 and 445 to respective power lines 475 and 485 and the switch controller 450 capable of controlling the switching (e.g., open/close) of the feedback line switches 430 and 440. For example, the electronic device 101 may include the voltage compensation circuit between the connector 410 and the power supply device 470. The feedback lines 435 and 445 may be configured at the dead ends of the connector 410 (e.g., the first connector 411 and the second connector 413) and connected to the power supply device 470.

According to one embodiment, the electronic device 101 may identify a voltage drop of a voltage supplied to an external device connected to the connector 410 by detecting a feedback at the dead end of the connector 410 (e.g., any one of the first connector 411 or the second connector 413) to which external device has been connected using the voltage compensation circuit. According to another embodiment, the electronic device 101 may identify a voltage drop of a voltage supplied to each of a plurality of external devices connected to the connector 410 by detecting feedback at the dead end of the connector 410 (e.g., each of the first connector 411 and the second connector 413) to which the external devices have been connected using the voltage compensation circuit, and may identify an external device that belongs to the plurality of external devices and that has a greater voltage drop.

In one embodiment, the electronic device 101 (e.g., the switch controller 450) may determine a compensation value (or compensation voltage) for compensating for a voltage drop for an external device based on a degree of the voltage drop, and may compensate for the voltage drop by compensating for (e.g., boosting) a supply voltage based on the determined compensation value. In one embodiment, when a voltage drop between a plurality of external devices is great, the electronic device 101 may determine a compensation value based on an external device having a smaller voltage drop.

According to one embodiment, the electronic device 101 (e.g., the switch controller 450) may check feedback on a boosted voltage by a compensation value, may drop the compensation value to a proper value when the boosted voltage is higher than the reference voltage (or given voltage) of a supply voltage for any one external device, and may provide the dropped voltage. According to various embodiments, at least some of the functions of the voltage compensation circuit (e.g., the switch controller 450) may be performed by another control circuit (e.g., the processor 120 in FIG. 1, or the charging circuit 280).

Referring to FIG. 4, power lines (e.g., the first power line 475 and the second power line 485) for reception paths may be wired between the first connector 411 and the charging circuits 480 and between the second connector 413 and the charging circuits 480, respectively. Power lines (e.g., the first power line 475 and the second power line 485) for transmission paths may be wired between the first connector 411 and the power supply device 470 and between the second connector 413 and the power supply device 470, respectively.

In one embodiment, the power lines for the transmission paths and the power lines for the reception paths have been divided and illustrated for convenience of description, but the power line for the transmission path and the power line for the reception path may be designed as a power line for a contact point in order to enable bidirectional power transmission (or transmission and reception) through one power line. For example, the wiring of a power line for receiving or supplying power using one power supply device 470 may be formed as a single path by integrating the power supply device 470 and the charging circuit 480 or may be formed as paths for the power supply device 470 and the charging circuit 480, respectively.

According to one embodiment, if one power line is used in one power supply device 470, the other path may be blocked when one path for any one of input and output is determined. For example, the electronic device 101 may not perform an output operation (e.g., power supply) in an input operation (e.g., power reception) of forming a path related to input (e.g., reception path) using a switch, and may not perform an input operation in an output operation of forming a path related to output 경로 (e.g., transmission path) using a switch.

According to one embodiment, the electronic device 101 may provide a voltage compensation to any one of or all outside connectors 410 when performing an output operation. In one embodiment, a power line for a reception path may be a power input line for transmitting (or bypassing) a power source from an external device (e.g., external power device) to the charging circuit 480 (or system). In one embodiment, a power line for a transmission path may be a power supply line for supplying power to an external device (e.g., power consumption device).

According to one embodiment, the power line 475 or 485 may operate as a path in a transmission mode (or Tx mode) or a reception mode (or Rx mode) depending on the type of external device (e.g., external power device or power consumption device). A power switch (e.g., the first or second transmission switch 471 or 473 and the first or second reception switch 481 or 483) for the power line 475 or 485 may be configured.

For example, the electronic device 101 may connect a power line to the charging circuit 480 by on (or close)-controlling a reception switch (e.g., the first reception switch 481 or the second reception switch 483 in a path to which an external power device has been connected) in the Rx mode (e.g., at least one power line 475 or 485 operates as a power input line), and may release a connection between the power line and the power supply device 470 by off (or open)-controlling a transmission switch (e.g., the first transmission switch 471 or the second transmission switch 473 in the path to which an external power device has been connected).

For another example, the electronic device 101 may connect a power line to the power supply device 470 by on (or close)-controlling a transmission switch (e.g., the first transmission switch 471 and/or the second transmission switch 473 in a path to which a power consumption device has been connected) in the Tx mode (e.g., at least one power line 475 or 485 operates as a power supply line, and may release a connection with the charging circuit 480 by off (or open)-controlling a reception switch (e.g., the first reception switch 481 and/or the second reception switch 483 in the path to which a power consumption device has been connected).

According to one embodiment, a first voltage input from an external device in the Rx mode may include a voltage higher than a second voltage supplied to an external device in the Tx mode. Accordingly, when the first voltage is input to the power supply device 470, the power supply device 470 may be damaged. In order to prevent this problem, the transmission switches 471 and 473 may be configured in the transmission paths so that a voltage from an external device to the power supply device 470 is blocked by making off the transmission switches 471 and 473 in the Rx mode.

According to various embodiments, feedback lines (e.g., the first feedback line 435 and the second feedback line 445) may be wired between the first connector 411 and the power supply device 470 and between the second connector 413 and the power supply device 470, respectively. According to various embodiments, one end of each of the feedback lines 435 and 445 may come into contact with each of the power lines 475 and 485 at each of the locations P1 and P2 closest to the connector 410 (e.g., the end of the connector 410 (or the end of the power line connected to the connector 410) or a location closest to the connector 410). The other end of each of the feedback lines 435 and 445 may be connected to the power supply device 470 through the voltage compensation circuit.

In one embodiment, a feedback line (e.g., the first feedback line 435 or the second feedback line 445) may be a power (or feedback) detection line for detecting feedback associated with a power source supplied to an external device in a power line connected to the connector 410 (e.g., the first connector 411 or the second connector 413) (e.g., at the end of the first power line 475 or the second power line 485 (e.g., a location closest to the connector 410)) in the Tx mode in which a power source is supplied from the power supply device 470 to an external device.

According to one embodiment, the feedback line 435, 445 may be connected to the power supply device 470 for feedback in the Tx mode, and a connection between the feedback line 435, 445 and the power supply device 470 may be released in the Rx mode. For example, the feedback line 435, 445 may include a feedback line switch (e.g., the first feedback line switch 430, the second feedback line switch 440). When a power source is supplied from the power supply device 470 to an external device connected to the connector 410 in the Tx mode, the feedback line 435, 445 may form (or connect) a feedback path with the power supply device 470 by making on (or closing) the feedback line switch 430, 440. For example, the feedback line 435, 445 may be configured to make on (or close) the feedback line switch 430, 440 of the feedback line 435, 445 when operating in the Tx mode in the path in which an external device has been connected and to make off (or open) the feedback line switch 430, 440 of the feedback line 435, 445 when operating in the Rx mode in the path in which an external device has been connected.

According to various embodiments, the feedback line 435, 445 may be brought into contact at one end P1, P2 of the power line 475, 485 (e.g., an end connected to the connector 410, for example, a location closest to the connector 410). A voltage compensation circuit, including the feedback line switch 430, 440 and the switch controller 450, may be configured at the feedback line 435, 445. A more accurate voltage compensation value can be calculated by detecting feedback at the end of the power line 475, 485 having a relatively long physical distance.

According to one embodiment, a case where external devices (e.g., power consumption devices) are connected to the electronic device 101 through the first connector 411 and the second connector 413, respectively, and the power supply device 470 supplies power sources to the respective external devices connected to the first connector 411 and the second connector 413 may be assumed. For example, the case may correspond to a case where the electronic device 101 operates in the Tx mode in which the first power line 475 and the second power line 485 are used as power supply lines.

In one embodiment, the switch controller 450 may connect the feedback lines 435 and 445 by on (or close)-controlling the first feedback line switch 430 and the second feedback line switch 440, respectively, in the Tx mode. According to one embodiment, when both the feedback line switches 430 and 440 operate (e.g., they are turned on), the switch controller 450 may compare a first voltage, detected through the first feedback line 435, with a second voltage detected through the second feedback line 445, and may connect (or transmit) a low voltage value to the power supply device 470.

According to one embodiment, a case where an external device (e.g., power consumption device) is connected to the electronic device 101 through the first connector 411, an external device is not connected to the second connector 413, and the power supply device 470 supplies a power source to the external device connected to the first connector 411 may be assumed. For example, the case may correspond to a case where the electronic device 101 operates in the Tx mode in which the first power line 475 is used as a power supply line.

In one embodiment, the switch controller 450 may on (or close)-control the first feedback line switch 430 for the connection of the first feedback line 435 brought into contact with the first power line 475 in the Tx mode. In one embodiment, the switch controller 450 may release a connection with the second feedback line 445 by off (or open)-controlling the second feedback line switch 440. According to one embodiment, the switch controller 450 may transmit, to the power supply device 470, feedback (e.g., feedback voltage) detected through the first feedback line 435. In one embodiment, when a feedback voltage is lower than a given voltage (e.g., a supply voltage designated to a connected external device), the power supply device 470 may compensate for (or boost) the given voltage and supply the compensated (or boosted) voltage to the external device.

According to one embodiment, a case where a first external device (e.g., external power device) is connected to the electronic device 101 through the first connector 411 and a second external device (e.g., power consumption device) is connected to the electronic device 101 through the second connector 413 may be assumed. For example, the case may correspond to a case where the electronic device 101 performs an Rx mode operation using the first power line 475 as a power input line and an Tx mode operation using the second power line 485 as a power supply line at the same time.

In one embodiment, the switch controller 450 may on (or close)-control the second feedback line switch 440 for a connection with the second feedback line 445 brought into contact with the second power line 485 in the Tx mode. In one embodiment, the switch controller 450 may release a connection with the first feedback line 435 by off (or open)-controlling the first feedback line switch 430. According to one embodiment, the switch controller 450 may transmit, to the power supply device 470, feedback (e.g., feedback voltage) detected through the second feedback line 445. In one embodiment, when a feedback voltage is lower than a given voltage (e.g., a supply voltage designated to a connected external device), the power supply device 470 may supply to a given voltage to an external device by compensating for (or boosting) the given voltage.

In one embodiment, the electronic device 101 may connect the charging circuit 480 and the first power line 475 in the Rx mode by making on (or closing) the first reception switch 481, and may release a connection between the first power line 475 and the power supply device 470 by making off (or opening) the first transmission switch 471. For example, the electronic device 101 may block a voltage input from an external device to the power supply device 470 by making off (or closing) the first transmission switch 471 and the first feedback line switch 430 in a path (e.g., the first power line 475) associated with the Rx mode.

In one embodiment, if the electronic device 101 supports a unidirectional power supply not a bidirectional power supply, the power switches 481 and 483 in the reception path and the power switches 471 and 473 in the transmission path may be omitted.

Figure 5:
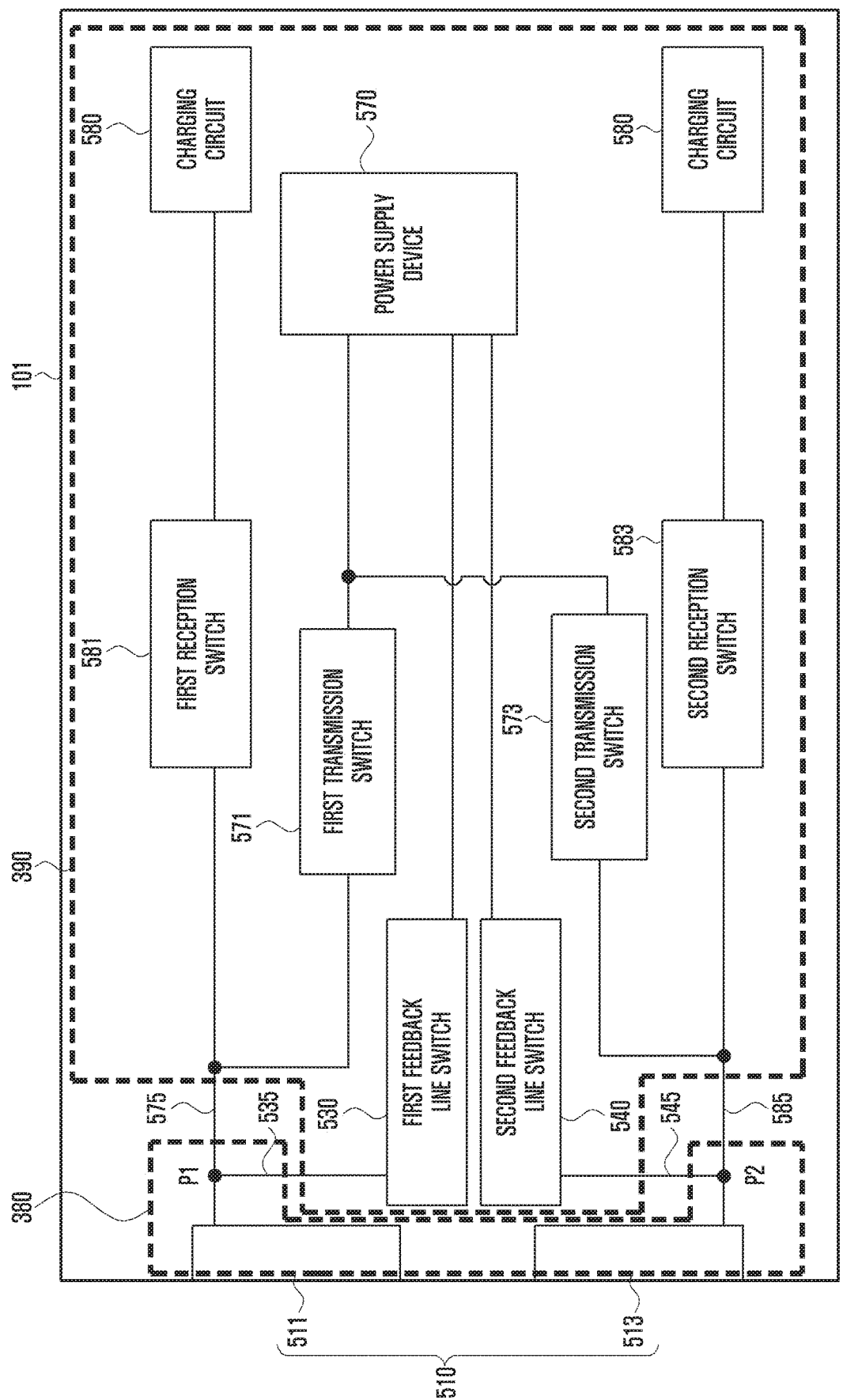
FIG. 5 is a diagram illustrating another example in which a voltage compensation circuit is configured in an electronic device according to an embodiment of the disclosure.

FIG. 5 is a diagram illustrating another example in which a voltage compensation circuit is configured in the electronic device 101 according to an embodiment of the disclosure.

Referring to FIG. 5, according to one embodiment, elements (e.g., a connector 510 (e.g., a first connector 511 and a second connector 513), voltage compensation circuits (e.g., a first feedback line switch 530 and a second feedback line switch 540), power switches 571, 573, 581, and 583, a power supply device 570, and charging circuits 580) illustrated in FIG. 5 may correspond to elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to FIGS. 2 and 4, and a detailed description of contents similar to the aforementioned operation is omitted.

According to one embodiment, although schematically illustrated in FIG. 5, the connector 510 may be positioned in the second PCB 380 (e.g., connector PCB), such as that illustrated in FIG. 3A and/or FIG. 3B. One end of a feedback line 535, 545 may be brought into contact with the connector 510 or a power line at a location P1, P2 closest to the connector 510 on the second PCB 380. The other end of the feedback line 535, 545 may be connected to the power supply device 570 through a feedback line switch (e.g., the first feedback line switch 530, the second feedback line switch 540). For example, the contact point locations P1 and P2 of the feedback lines 535 and 545 for feedback detection may be designed to be closest to the connector 510. In one embodiment, voltage compensation circuits (e.g., the first feedback line switch 530, the second feedback line switch 540), power switches (e.g., the first transmission switch 571, the second transmission switch 573, the first reception switch 581, and the second reception switch 583), the power supply device 570, and the charging circuits 580 may be designed in the first PCB 390 (e.g., main PCB), such as that illustrated in FIG. 3A and/or FIG. 3B.

FIG. 5 illustrate an example of a circuit configuration in which at least some (e.g., the switch controller 450 in FIG. 4) of the voltage compensation circuits is included in (e.g., integrated into) the power supply device 570 in a voltage compensation circuit configuration, such as that illustrated in FIG. 4. An example in which the power supply device 570 supplies a power source to each of external devices connected to the first connector 511 and the second connector 513 is described with reference to FIG. 5.

According to various embodiments, if the switch controller 450 is included in the power supply device 570 and the power supply device 570 supplies power sources to external devices (e.g., a first external device connected to the first connector 511 and a second external device connected to the second connector 513) as described in the portion described with reference to FIG. 4, the electronic device 101 may make on (or close) the first feedback line switch 530 of the first feedback line 535 and the second feedback line switch 540 of the second feedback line 545. According to one embodiment, the first feedback line 535 and the second feedback line 545 may be directly connected to the power supply device 570 through the feedback line switches 530 and 540, respectively. In one embodiment, first feedback (or a first feedback voltage) passing through the first feedback line switch 530 and second feedback (or a second feedback voltage) passing through the second feedback line switch 540 may be transmitted to the power supply device 570.

According to one embodiment, as described in the portion described with reference to FIG. 4, when the power supply device 570 supplies a power source to one external device (e.g., an external device connected to the first connector 511 or the second connector 513), the power supply device 570 may detect a first voltage (e.g., a voltage less than a given reference voltage) or detect a related signal as first feedback or second feedback at the location P1 or P2 close to the connector 510 through the first feedback line 535 or the second feedback line 545.

In one embodiment, when a first voltage or a related signal is detected as first feedback or second feedback, the power supply device 570 may boost a voltage output to an external device. For example, when a relatively low feedback voltage is detected, the power supply device 570 may supply a first given voltage to an external device through boosting (e.g., first voltage compensation). According to one embodiment, after voltage boosting, the power supply device 570 may detect an output voltage, passing through the power line 575 or 585, or an output voltage at the location P1 or P2 close to the connector 510 as first feedback or second feedback for a second voltage (e.g., a voltage equal to or higher than a given reference voltage or a voltage higher than a first voltage).

In one embodiment, when a relatively high feedback voltage is detected, the power supply device 570 may supply a second given voltage to an external device through the adjustment of the amount of boosting or the drop (e.g., second voltage compensation) of the amount of a voltage boosted based on a low voltage. In one embodiment, a second given voltage may include a voltage lower than a first given voltage.

According to various embodiments, the voltage boosting operation of the power supply device 570 may be determined through a separate control circuit (e.g., the processor 120 in FIG. 1), a voltage compensation circuit (e.g., the voltage compensation circuit 220 in FIG. 2) or the power supply device 570 including the voltage compensation circuit 220.

In one embodiment, the electronic device 101 may connect the first feedback line switch 530 and the second feedback line switch 540 to the feedback lines 535 and 545, respectively, by on (or close)-controlling the first feedback line switch 530 and the second feedback line switch 540 in the Tx mode. According to one embodiment, when both the feedback line switches 530 and 540 operate (e.g., when they are turned on), the power supply device 570 may directly compare a first feedback voltage, detected through the first feedback line 535, with a second feedback voltage detected through the second feedback line 545, and may compensate for (e.g., boost) a voltage based on a lower feedback voltage so that a maximum of a given voltage is supplied to an external device (or a voltage drop is compensated for). According to one embodiment, a voltage compensation (e.g., boosting) may be performed based on a relatively lower feedback voltage. A voltage compensation (e.g., adjust the amount of boosting and/or relatively lower (or drop) the amount of a voltage boosted based on a low voltage) may be performed based on a relatively higher feedback voltage.

Figure 6:
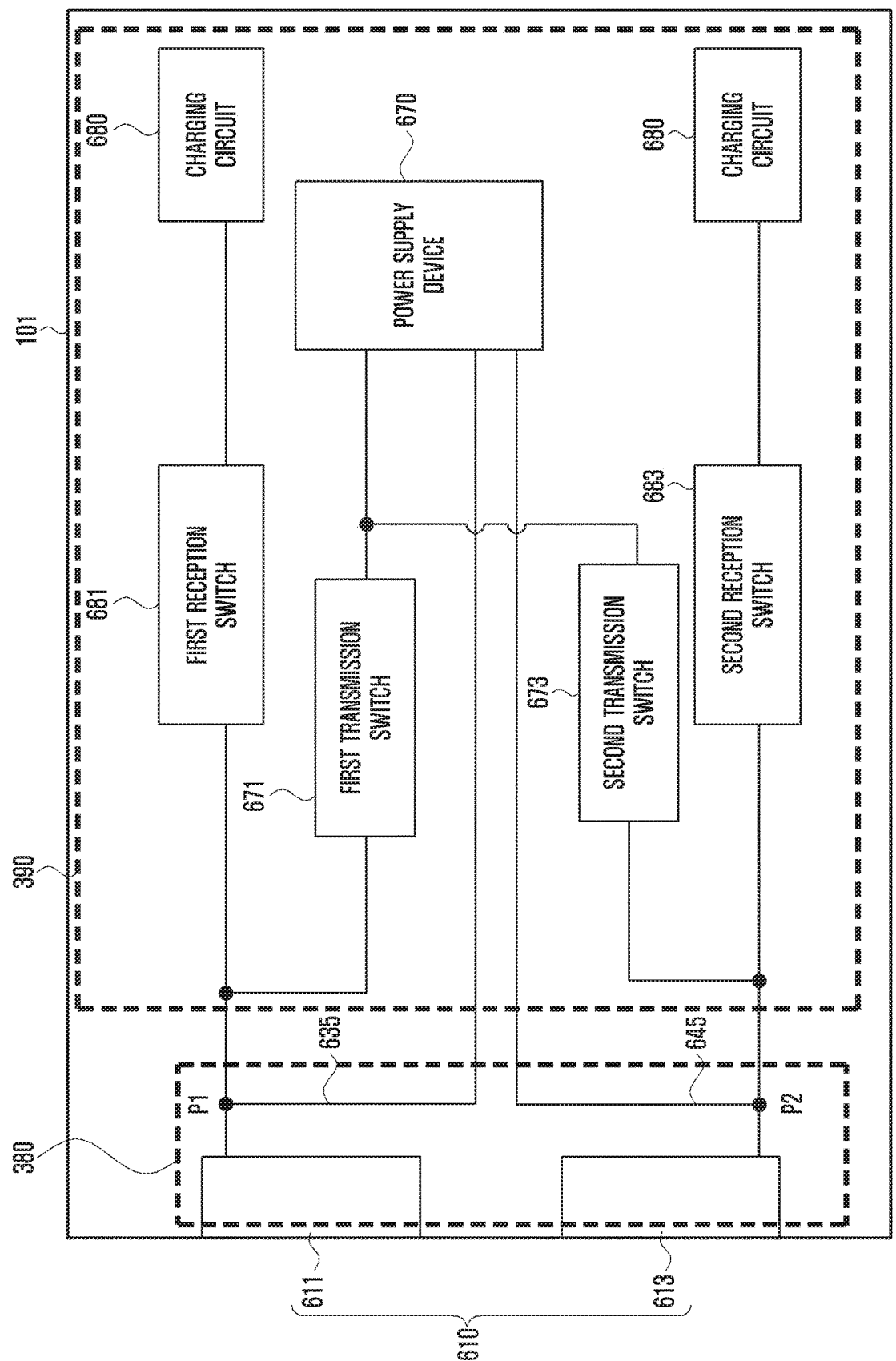
FIG. 6 is a diagram illustrating another example in which a voltage compensation circuit is configured in an electronic device according to an embodiment of the disclosure.

FIG. 6 is a diagram illustrating another example in which a voltage compensation circuit is configured in the electronic device 101 according to an embodiment of the disclosure.

Referring to FIG. 6, according to one embodiment, elements (e.g., a connector 610 (e.g., a first connector 611 and a second connector 613), power switches 671, 673, 681, and 683, a power supply device 670, and charging circuits 680) illustrated in FIG. 6 may correspond to elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to, FIG. 2 and FIG. 4, and a detailed description of contents similar to the aforementioned operation is omitted.

According to one embodiment, although schematically illustrated in FIG. 6, the connector 610 may be positioned in the second PCB 380 (e.g., connector PCB), such as that illustrated in FIG. 3A and/or FIG. 3B. One end of a feedback line 635, 645 may be brought into contact with the connector 610 or a power line at a location P1, P2 closest to the connector 610 on the second PCB 380. The other end of the feedback line 635, 645 may be connected to the power supply device 670. For example, the contact point locations P1 and P2 of the feedback lines 635 and 645 for feedback detection may be designed to be closest to the connector 610. In one embodiment, power switches (e.g., the first transmission switch 671, the second transmission switch 673, the first reception switch 681, and the second reception switch 683), the power supply device 670, and the charging circuits 680 may be designed in the first PCB 390 (e.g., main PCB), such as that illustrated in FIG. 3A and/or FIG. 3B. A voltage compensation circuit may be included in the power supply device 670.

FIG. 6 may illustrate an example of a circuit configuration in which all voltage compensation circuits (e.g., the first feedback line switch 430, the second feedback line switch 440, and the switch controller 450 in FIG. 4) are included in (or integrated into) the power supply device 670 in a voltage compensation circuit configuration such as that illustrated in FIG. 4. An example in which the power supply device 670 supplies power sources to external devices connected to the first connector 611 and the second connector 613, respectively, is schematically described with reference to FIG. 6.

According to various embodiments, the electronic device 101 may include the power supply device 670, including a voltage compensation circuit or a function circuit corresponding to the voltage compensation circuit. The power supply device 670 may include a function capable of making on/off feedback path connections according to the first feedback line 635 and the second feedback line 645. According to one embodiment, the first feedback line 635 and the second feedback line 645 may be directly connected to the power supply device 670. In one embodiment, the electronic device 101 may on-control the feedback path connections within the power supply device 670 so that the first feedback line 635 and the second feedback line 645 are connected in the Tx mode.

According to one embodiment, when a feedback path connection between the first feedback line 635 and the second feedback line 645 becomes on/off and a feedback path for the first feedback line 635 and the second feedback line 645 becomes on, the power supply device 670 may compare a first feedback voltage, detected through the first feedback line 635, with a second feedback voltage detected through the second feedback line 645, and may compensate for (e.g., boost) a voltage based on a lower feedback voltage so that a maximum of a given voltage is supplied to an external device (or a voltage drop is compensated for).

According to one embodiment, when the power supply device 670 supplies a power source to one external device (e.g., an external device connected to the first connector 611 or the second connector 613), the power supply device 670 may detect a first voltage (e.g., a voltage less than a given reference voltage) or detect a related signal as first feedback or second feedback through the first feedback line 635 or the second feedback line 645 at a location P1 or P2 close to the connector 610.

In one embodiment, when a first voltage or related signal is detected as first feedback or second feedback, the power supply device 670 may boost a voltage output to an external device. According to one embodiment, after voltage boosting, the power supply device 670 may detect an output voltage passing through a power line or an output voltage at the location P1 or P2 close to the connector 610 as first feedback or second feedback for a second voltage (e.g., a voltage equal to or higher than a given reference voltage or a voltage higher than a first voltage). According to various embodiments, the voltage boosting operation of the power supply device 670 may be determined through the power supply device 670, including a separate control circuit (e.g., the processor 120 in FIG. 1), a voltage compensation circuit (e.g., the voltage compensation circuit 220 in FIG. 2) or the voltage compensation circuit 220.

Figure 7:
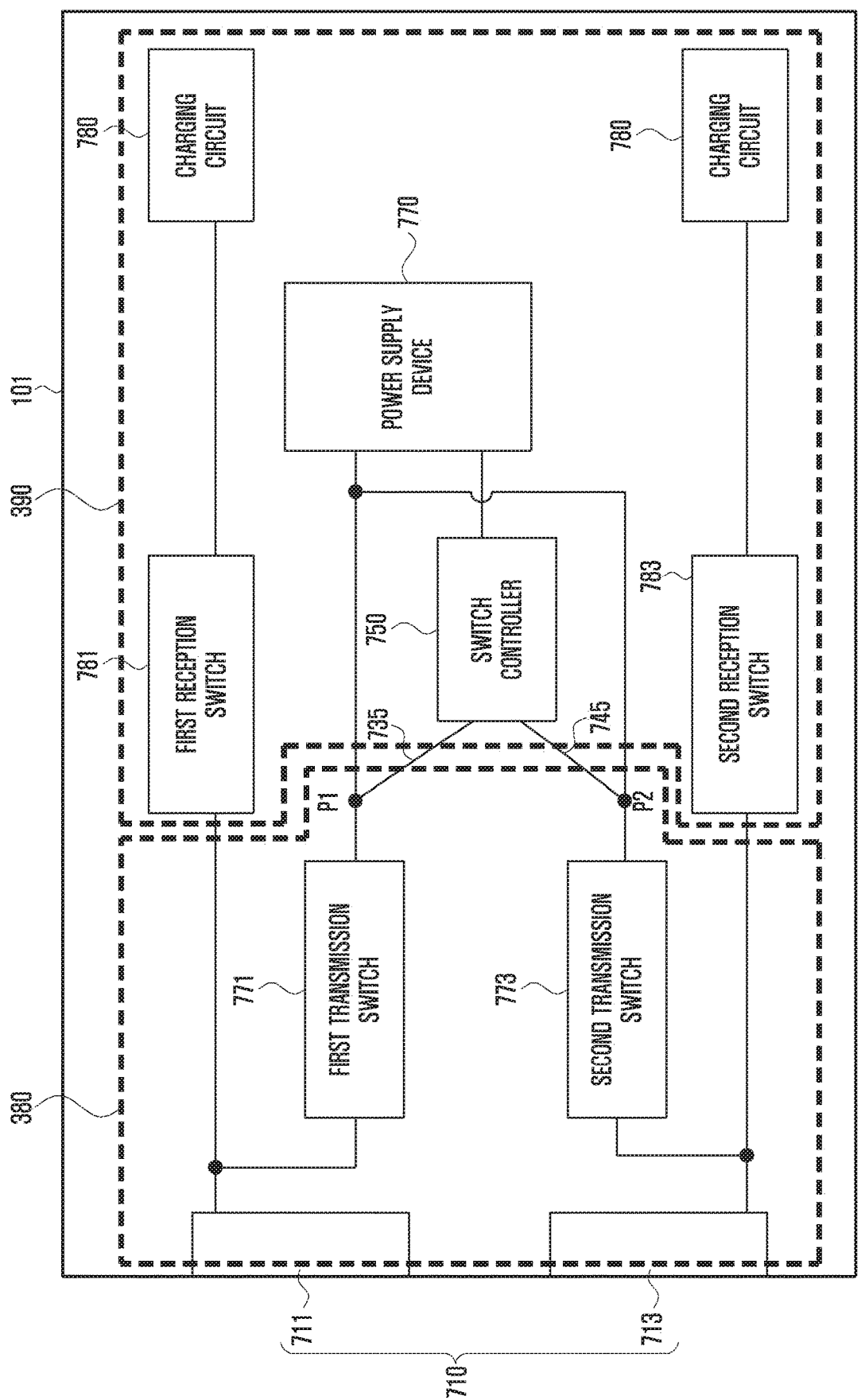
FIG. 7 is a diagram illustrating another example in which a voltage compensation circuit is configured in an electronic device according to an embodiment of the disclosure.

FIG. 7 is a diagram illustrating another example in which a voltage compensation circuit is configured in the electronic device 101 according to an embodiment of the disclosure.

Referring to FIG. 7, according to one embodiment, elements (e.g., a connector 710 (e.g., a first connector 711 and a second connector 713), power switches 771, 773, 781, and 783, a switch controller 750, a power supply device 770, and charging circuits 780) illustrated in FIG. 7 may correspond to elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to FIGS. 2 and 4, and a detailed description of contents similar to the aforementioned operation is omitted.

FIG. 7 may illustrate an example of a circuit configuration for feedback detection, wherein some (e.g., the switch controller 450 in FIG. 4) of voltage compensation circuits are disposed (or designed) between the transmission switches 771 and 773 and the power supply device 770 and the transmission switches 771 and 773 are disposed to be closest to the connector 710 (e.g., the first connector 711 and the second connector 713) in a voltage compensation circuit configuration, such as that illustrated in FIG. 4.

According to one embodiment, although schematically illustrated in FIG. 7, the connector 710 and a transmission switch (e.g., the first transmission switch 771 or the second transmission switch 773) may be positioned in the second PCB 380 (e.g., connector PCB), such as that illustrated in FIG. 3A and/or FIG. 3B. One end of each of feedback lines 735 and 745 may be brought into contact with a power line within each of the transmission switches 771 and 773 or each of locations P1 and P2 closest to each of the transmission switches 771 and 773. The other end of each of the feedback lines 735 and 745 may be connected to the power supply device 770 through the switch controller 750. For example, the contact point locations P1 and P2 of the feedback lines 735 and 745 for feedback detection may be designed to be closest to the connector 710.

In one embodiment, reception switches (e.g., the first reception switch 781 and the second reception switch 783), the switch controller 750, the power supply device 770, and the charging circuit 780 may be designed in the first PCB 390 (e.g., main PCB), such as that illustrated in FIG. 3A and/or FIG. 3B. An example in which the power supply device 770 supplies power sources to external devices connected to the first connector 711 and the second connector 713, respectively is schematically described with reference to FIG. 7.

According to various embodiments, in FIG. 7, the configuration of a feedback line switch for a connection with a feedback line may be omitted, and feedback lines (e.g., the first feedback line 735 and the second feedback line 745) may be wired to be closest to the transmission switches 771 and 773.

According to one embodiment, the electronic device 101 may form feedback paths by making on the transmission switches 771 and 773 so that the first feedback line 735 and the second feedback line 745 are connected to the respective power lines in the Tx mode. According to one embodiment, when both the feedback paths of the first feedback line 735 and the second feedback line 745 become on, the switch controller 750 may compare a first feedback voltage, detected through the first feedback line 735, with a second feedback voltage detected through the second feedback line 745, and may connect (or transmit) a lower feedback voltage to the power supply device 770. In one embodiment, the power supply device 770 may compensate for (e.g., boost) a voltage based on a received feedback voltage so that a maximum of a given voltage is supplied (or a voltage drop is compensated for) to an external device.

According to one embodiment, when the power supply device 770 supplies a power source to one external device (e.g., an external device connected to the first connector 711 or the second connector 713), the power supply device 770 may detect a first voltage (e.g., a voltage less than a given reference voltage) as first feedback or second feedback through the first feedback line 735 or the second feedback line 745 of the location P1 or P2 close to the connector 710. In one embodiment, when detecting the first voltage as the first feedback or the second feedback, the power supply device 770 may boost a voltage output to the external device. According to one embodiment, after the voltage boosting, the power supply device 770 may detect an output voltage passing through a power line or an output voltage at the location P1 or P2 close to the connector 710 as the first feedback or the second feedback for a second voltage (e.g., a voltage equal to or higher than a given reference voltage or a voltage higher than the first voltage).

According to various embodiments, the voltage boosting operation of the power supply device 770 may be determined through the power supply device 770, including a separate control circuit (e.g., the processor 120 in FIG. 1), a voltage compensation circuit (e.g., the voltage compensation circuit 220 in FIG. 2) or the voltage compensation circuit 220.

Figure 8:
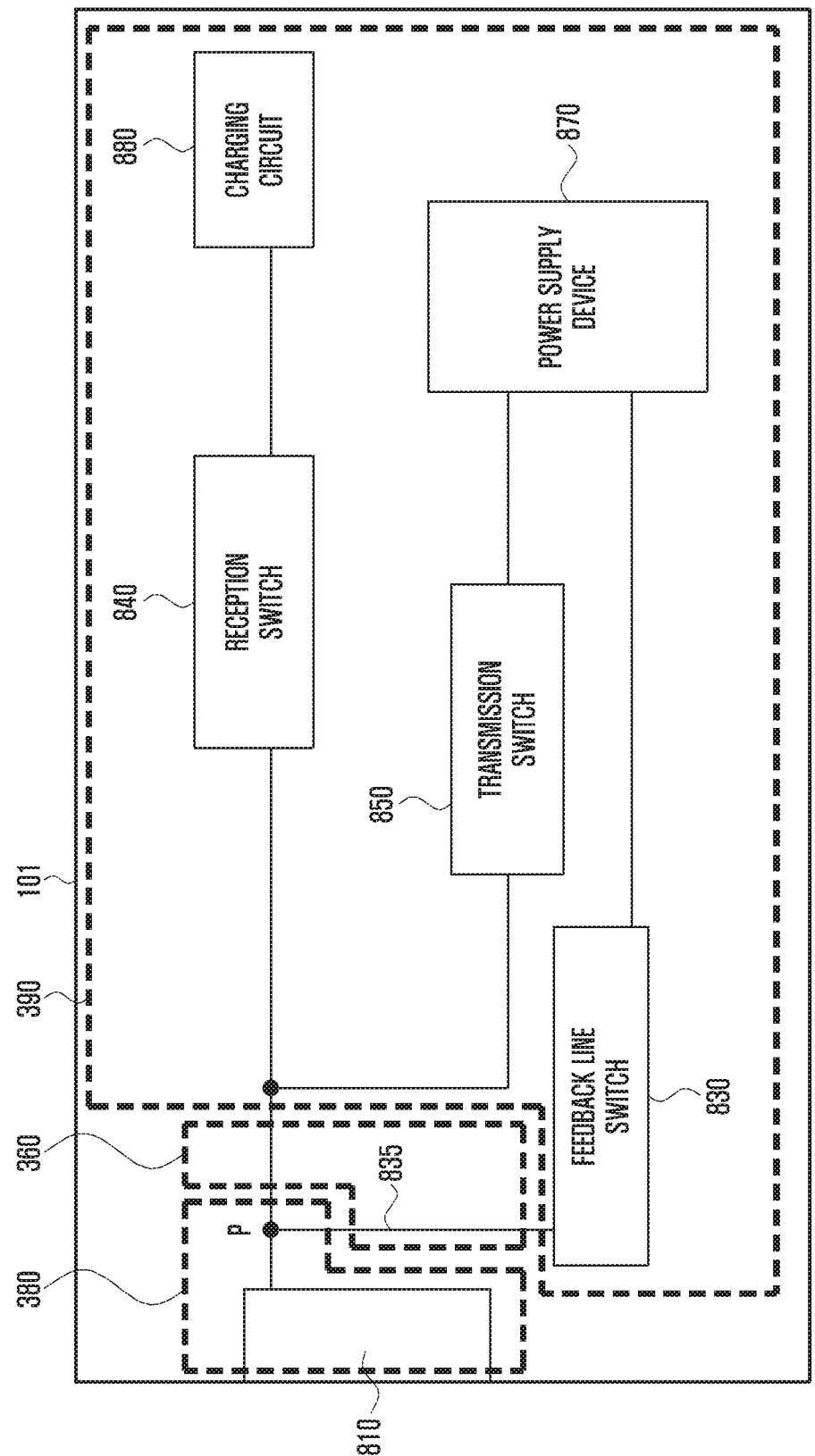
FIG. 8 is a diagram illustrating another example in which a voltage compensation circuit is configured in an electronic device according to an embodiment of the disclosure.

FIG. 8 is a diagram illustrating another example in which a voltage compensation circuit is configured in the electronic device 101 according to an embodiment of the disclosure.

Referring to FIG. 8, according to one embodiment, elements (e.g., a connector 810, a voltage compensation circuit (e.g., a feedback line switch 830), power switches 840 and 850, a power supply device 870, and a charging circuit 880) illustrated in FIG. 8 may correspond to elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to FIGS. 2 and 4, and a detailed description of contents similar to the aforementioned operation is omitted.

FIG. 8 may illustrate an example in which the electronic device 101 includes one connector 810 and one power supply device 870 supplies a power source to an external device connected to the connector 810. FIG. 8 may illustrate an example of a circuit configuration in which at least some (e.g., the switch controller 450 in FIG. 4) of a voltage compensation circuit is included in (e.g., integrated into) the power supply device 870 in a voltage compensation circuit configuration, such as that illustrated in FIG. 4.

According to one embodiment, although schematically illustrated in FIG. 8, one end of each of the connector 810 and a feedback line 835 may be positioned in the second PCB 380 (e.g., connector PCB), such as that illustrated in FIG. 3A and/or FIG. 3B. One end of the feedback line 835 may be brought into contact with a power line a location P closest to the connector 810. The other end of the feedback line 835 may be connected to power supply device 870 through the feedback line switch 830. For example, the contact point location P of the feedback line 835 for feedback detection may be designed to be closest to the connector 810.

In one embodiment, the reception switch 840, the transmission switch 850, the power supply device 870, and the charging circuit 880 may be designed in the first PCB 390 (e.g., main PCB), such as that illustrated in FIG. 3A and/or FIG. 3B. In one embodiment, the power line and the feedback line 835 may be wired through the FPCB 360, such as that illustrated in FIG. 3A and/or FIG. 3B. An example in which the power supply device 870 supplies a power source to an external device connected to the connector 810 is schematically described with reference to FIG. 8.

According to various embodiments, if the switch controller 450 is included in the power supply device 870 and the power supply device 870 supplies a power source to an external device (e.g., an external device connected to the connector 810) as described in the portion described with reference to FIG. 4, the electronic device 101 may make on (or close) the feedback line switch 830 of the feedback line 835. According to one embodiment, the feedback line 835 may be connected to the power supply device 870 through the feedback line switch 830. In one embodiment, feedback (or a feedback voltage) passing through the feedback line switch 830 may be transmitted to the power supply device 870.

In one embodiment, the electronic device 101 may connect the feedback line switch 830 to the feedback line 835 by on (or close)-controlling the feedback line switch 830 in the Tx mode. According to one embodiment, when the feedback line switch 830 operates, the power supply device 870 may compensate for (e.g., boost) a voltage based on a feedback voltage detected through the feedback line 835 so that a maximum of a given voltage is supplied to an external device (or a voltage drop is compensated for).

Figure 9:
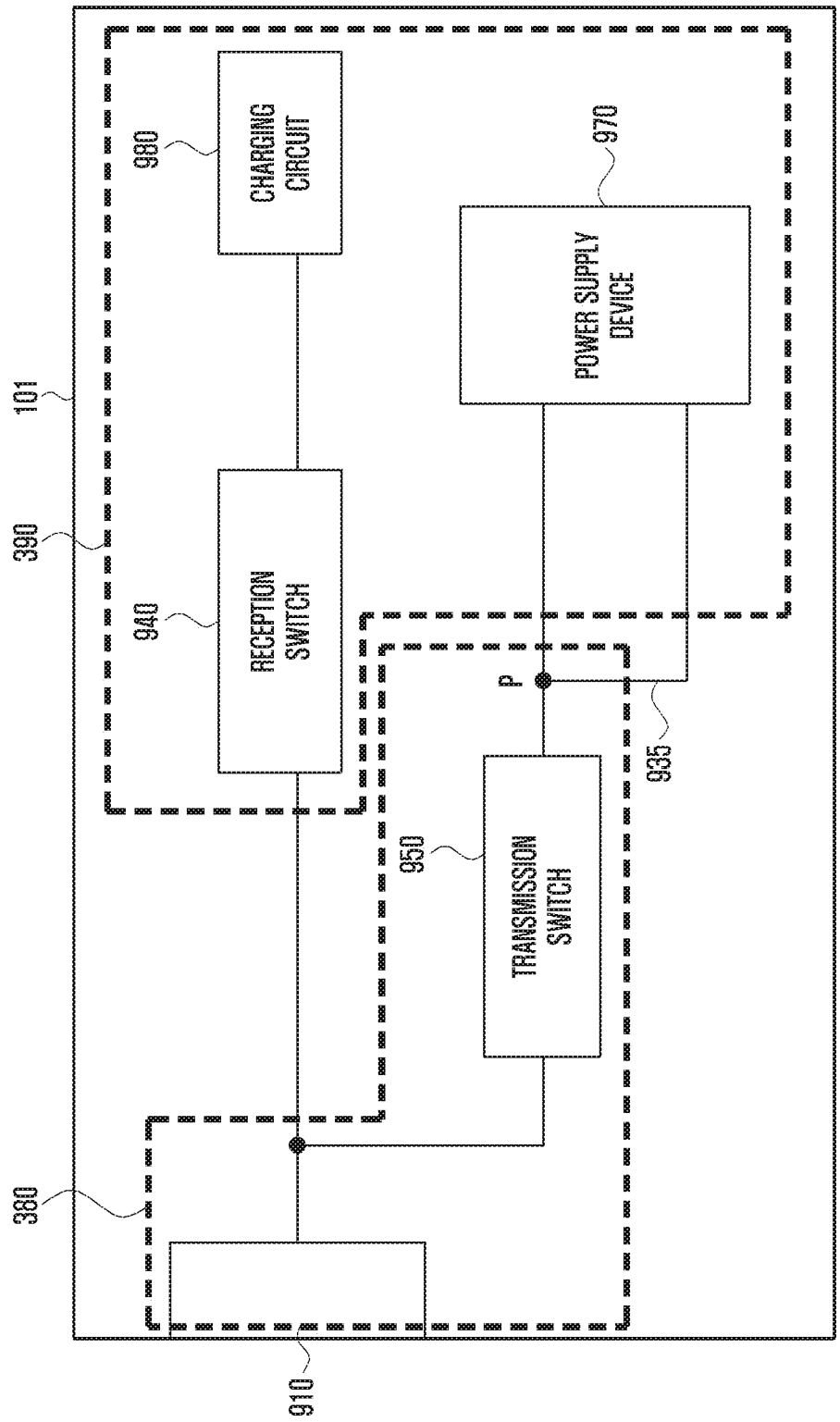
FIG. 9 is a diagram illustrating another example in which a voltage compensation circuit is configured in an electronic device according to an embodiment of the disclosure.

FIG. 9 is a diagram illustrating another example in which a voltage compensation circuit is configured in the electronic device 101 according to an embodiment of the disclosure.

Referring to FIG. 9, according to one embodiment, elements (e.g., a connector 910, power switches 940 and 950, a power supply device 970, and a charging circuit 980) illustrated in FIG. 9 may correspond to elements (e.g., the connector 210, the voltage compensation circuit 220 (e.g., the first feedback line switch 230, the second feedback line switch 240, and the switch controller 250), the control circuit 260, the power switches 271, 273, 281, and 283, the power supply device 270, and the charging circuit 280), such as those described in the portion described with reference to FIGS. 2 and 4, and a detailed description of contents similar to the aforementioned operation is omitted.

FIG. 9 may illustrate an example in which the electronic device 101 includes the one connector 810 and the one power supply device 870 supplies a power source to an external device connected to the connector 810. FIG. 9 may illustrate an example of a circuit configuration in which all voltage compensation circuits (e.g., the first feedback line switch 430, the second feedback line switch 440, and the switch controller 450 in FIG. 4) are included in (or integrated into) the power supply device 970 in a voltage compensation circuit configuration, such as that illustrated in FIG. 4.

According to one embodiment, although schematically illustrated in FIG. 9, the connector 910 and the transmission switch 950 may be disposed in the second PCB 380 (e.g., connector PCB), such as that illustrated in FIG. 3A and/or FIG. 3B. One end of a feedback line 935 may be brought into contact with a power line within the transmission switch 950 or a location P closest to the transmission switch 950. The other end of the feedback line 935 may be connected to the power supply device 970. For example, the contact point location P of the feedback line 935 for feedback detection may be designed to be closest to the connector 910. In one embodiment, the reception switch 940, the power supply device 970, and the charging circuit 980 may be designed in the first PCB 390 (e.g., main PCB), such as that illustrated in FIG. 3A and/or FIG. 3B. In one embodiment, the power line and the feedback line 935 may be wired through the FPCB 360, such as that illustrated in FIG. 3A and/or FIG. 3B. An example in which the power supply device 970 supplies a power source to an external device connected to the connector 910 is schematically described with reference to FIG. 9.

According to various embodiments, the electronic device 101 may include a voltage compensation circuit or a function circuit, corresponding to the voltage compensation circuit, in the power supply device 970. The power supply device 970 may include a function capable of making on/off a feedback path connection according to the feedback line 935. According to one embodiment, a circuit for feedback detection may be configured by positioning the transmission switch 950 at a location closest to the connector 910, omitting the configuration of a feedback line switch for the connection of the feedback line 935, and positioning the feedback line 935 at a location closest to the transmission switch 950.

According to one embodiment, the electronic device 101 may form a feedback path by making on the transmission switch 950 so that the feedback line 935 is connected to the power line in the Tx mode. According to one embodiment, when the feedback path of the feedback line 935 becomes on, the power supply device 970 may compensate for (e.g., boost) a voltage based on a feedback voltage detected through the feedback line 935 so that a maximum of a given voltage is supplied to an external device (or a voltage drop is compensated for).

The electronic device 101 according to various embodiments of the disclosure may include a power supply device (e.g., the power supply device 270 in FIG. 2), at least one connector (e.g., the connector 210 in FIG. 2) for a connection with an external device, a power line (e.g., the power line 275, 285 in FIG. 2) wired between the power supply device and the connector, a feedback line (e.g., the feedback line 235, 245 in FIG. 2) brought into contact with the power line at a location adjacent to the connector between the power supply device and the connector, a voltage compensation circuit (e.g., the voltage compensation circuit 220 in FIG. 2) detecting feedback on a supply voltage supplied to an external device at the location adjacent to the connector using the feedback line, and a control circuit (e.g., the control circuit 260 in FIG. 2 or the processor 120 in FIG. 1) configured to control a compensation related to the supply voltage based on the detected feedback.

According to various embodiments, the electronic device 101 includes a first connector (e.g., the first connector 211 in FIG. 2) and a second connector (e.g., the second connector 213 in FIG. 2). The voltage compensation circuit may include a first feedback line switch (e.g., the first feedback line switch 230 in FIG. 2) for the connection of a first feedback line (e.g., the first feedback line 235 in FIG. 2) associated with the first connector, a second feedback line switch (e.g., the second feedback line switch 240 in FIG. 2) for the connection of a second feedback line (e.g., the second feedback line 245 in FIG. 2) associated with the second connector, and a switch controller (e.g., the switch controller 250 in FIG. 2) configured to control the switching of the first feedback line switch and the second feedback line switch.

According to various embodiments, the electronic device 101 may be configured so that one end of the feedback line is brought into contact with the power line at a location closest to the connector and the other end of the feedback line is connected to the power supply device through the voltage compensation circuit.

According to various embodiments, the location closest to the connector may include the end of the connector or the location closest to the connector.

According to various embodiments, the electronic device 101 may include a first printed circuit board (PCB) (e.g., the first PCB 390 in FIG. 3A or 3B) including at least one of the power supply device, the voltage compensation circuit or the control circuit, a second PCB (e.g., the second PCB 380 in FIG. 3A or 3B) including the connector, and an FPCB (e.g., the FPCB 360 in FIG. 3A or 3B) for a connection between the first PCB and the second PCB. The FPCB may include the power line and the feedback line.

According to various embodiments, the connector may include at least one outside connector (e.g., the outside connector 320 in FIG. 3A or 3B) for a connection with an external device and at least one pair of inside connector (e.g., the inside connectors 310A and 310B in FIG. 3A or 3B) electrically connected to the outside connector and formed at both ends of the FPCB.

According to various embodiments, the inside connector may include a first connector (e.g., the first connector 310A in FIG. 3A or 3B) positioned at a location adjacent to the outside connector on the second PCB and a second connector (e.g., the second connector 310B in FIG. 3A or 3B) positioned at a location adjacent to the power supply device on the first PCB. The first connector of the second PCB and the second connector of the first PCB may be connected through the FPCB.

According to various embodiments, when the electronic device 101 supplies a voltage to a plurality of external devices based on the power supply device, the voltage compensation circuit may be configured to detect feedback on a supply voltage at the location closest to the connector.

According to various embodiments, when both the first feedback line switch and the second feedback line switch operate, the voltage compensation circuit may be configured to compare a first feedback voltage detected through the first feedback line with a second feedback voltage detected through the second feedback line.

According to various embodiments, the voltage compensation circuit may be configured to transmit, to the control circuit, a lower feedback voltage of the first feedback voltage and the second feedback voltage.

According to various embodiments, the control circuit may compensate for a voltage based on a relatively low feedback voltage, and may supply a given first voltage to the external device.

According to various embodiments, the control circuit may compensate for a voltage based on a relatively high feedback voltage, and may supply a given second voltage to the external device.

According to various embodiments, the control circuit may be configured to supply an external device with a given first voltage by performing a first voltage compensation based on a relatively low feedback voltage and to supply an external device with a given second voltage by performing a second voltage compensation based on a relatively high feedback voltage. The second voltage may include a voltage lower than the first voltage. The first voltage compensation may include boosting. The second voltage compensation may include at least one of the adjustment of the amount of boosting or the drop of the amount of a voltage boosted based on a low voltage.

According to various embodiments, the control circuit may be configured to check feedback on a compensated voltage based on the feedback voltage and to drop the compensated voltage when the compensated voltage is higher than a given voltage of any one external device.

According to various embodiments, the voltage compensation circuit may be configured to detect a voltage through the feedback line at a location closest to the connector in order to detect feedback on a supply voltage supplied to an external device connected to the connector.

According to various embodiments, the control circuit may be configured to boost a voltage output to the external device when a voltage less than a given reference voltage is detected based on the feedback on the supply voltage.

According to various embodiments, the electronic device 101 may be configured so that the power supply device includes at least some of the voltage compensation circuit.

According to various embodiments, the electronic device 101 may be configured so that the control circuit includes the voltage compensation circuit.

The electronic device 101 according to various embodiments of the disclosure may include a power supply device (e.g., the power supply device 270 in FIG. 2), at least one connector (e.g., the connector 210 in FIG. 2) for a connection with an external device, a power line (e.g., the power lines 275 and 285 in FIG. 2) wired between the power supply device and the at least one connector, a feedback line (e.g., the feedback lines 235 and 245 in FIG. 2) formed to come into contact with a power line at a location adjacent to the connector, a voltage compensation circuit (e.g., the voltage compensation circuit 220 in FIG. 2) for detecting feedback on a supply voltage supplied to the external device, and a control circuit (e.g., the control circuit 260 in FIG. 2 or the processor 120 in FIG. 1). The control circuit may determine a voltage output by the power supply device based on a signal related to the supply voltage of the voltage compensation circuit.

According to various embodiments, the electronic device 101 may include a first connector (e.g., the first connector 211 in FIG. 2) and a second connector (e.g., the second connector 213 in FIG. 2). The voltage compensation circuit may include a first feedback line switch (e.g., the first feedback line switch 230 in FIG. 2) for the connection of a first feedback line (e.g., the first feedback line 235 in FIG. 2) associated with the first connector and a second feedback line switch (e.g., the second feedback line switch 240 in FIG. 2) for the connection of a second feedback line (e.g., the second feedback line 245 in FIG. 2) associated with the second connector. A voltage is detected through the first feedback line or the second feedback line in order to detect feedback on a supply voltage supplied to an external device connected to the first connector or the second connector.

According to various embodiments, the voltage compensation circuit may include a switch controller (e.g., the switch controller 250 in FIG. 2) configured to control the switching of the first feedback line switch and the second feedback line switch. When a power source is supplied to the external device connected to the first connector or the second connector, the switch controller may control the first feedback line switch or the second feedback line switch in order to check the supply voltage through the first feedback line or the second feedback line.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   a power supply device disposed on a first printed circuit board (PCB) of the electronic device;
   a connector formed on a second PCB of the electronic device and configured to be electrically connected to an external device;
   a flexible printed circuit board (FPCB) configured to be electrically connected to the power supply device of the first PCB and the connector of the second PCB, the FPCB including a power line and a feedback line;
   a first inside connector electrically connected to the connector through the second PCB and a second inside connector electrically connected to the power supply device through the first PCB, wherein the first inside connector and the second inside connector are formed at both ends of the FPCB and electrically connected to each other through the FPCB;
   a voltage compensation circuit configured to detect feedback on a supply voltage supplied from the power supply device to the external device connected to the connector at a contact point of the power line and the feedback line and to compensate the supply voltage based on the detected feedback, wherein the contact point is a location closest to the connector; and
   a control circuit configured to control a voltage output by the power supply device based on a signal related to the supply voltage of the voltage compensation circuit,
   wherein the power line is wired between the power supply device of the first PCB and the connector of the second PCB,
   wherein the feedback line is wired between the power supply device of the first PCB and the connector of the second PCB,
   wherein one end of the feedback line is brought into contact with the power line at the contact point, and
   wherein another end of the feedback line is connected to the power supply device through the voltage compensation circuit.

2. The electronic device of claim 1, wherein the location closest to the connector comprises an end of the connector or the location closest to the connector on the power line.

3. The electronic device of claim 1,
   wherein the at least one connector comprises
   a first connector and
   a second connector,
   wherein the FPCB comprises
   a first FPCB configured to be electrically connected to the first connector and
   a second FPCB configured to be electrically connected to the second connector, and
   wherein the first inside connector and the second inside connector comprise:
      a pair of inside connectors formed at both ends of the first FPCB and electrically connected through the first FPCB, and electrically connected to the first connector,
      another pair of inside connectors formed at both ends of the second FPCB and electrically connected through the second FPCB, and electrically connected to the second connector.

4. The electronic device of claim 3,
   wherein the pair of inside connectors comprise the first inside connector and the second inside connector,
   wherein the other pair of inside connectors comprise a third inside connector and a fourth inside connector,
   wherein the first inside connector and the third inside connector are positioned at a location closest to the first connector and the second connector, respectively, on the second PCB, and
   wherein the second inside connector and the fourth inside connector are positioned at a location adjacent to the power supply device, respectively, on the first PCB.

5. The electronic device of claim 3, wherein the electronic device is configured so that the power supply device comprises at least some of the voltage compensation circuit.

6. The electronic device of claim 3, wherein the voltage compensation circuit comprises:
   a first feedback line switch for switching a connection of a first feedback line of the first FPCB electrically connected to the first connector,
   a second feedback line switch for switching a connection of a second feedback line of the second FPCB electrically connected to the second connector, and
   a switch controller configured to control switching of the first feedback line switch and the second feedback line switch.

7. The electronic device of claim 6,
   wherein, when the external device is electrically connected to the first connector or the second connector, the voltage compensation circuit is further configured to detect a voltage through the first feedback line or the second feedback line corresponding to the first connector or the second connector, respectively.

8. The electronic device of claim 7,
wherein the switch controller is further configured to control the first feedback line switch or the second feedback line switch to connect a feedback line corresponding to the connector to which the external device is connected.

9. The electronic device of claim 6, wherein, when both the first feedback line switch and the second feedback line switch operate, the voltage compensation circuit is further configured to:
compare a first feedback voltage detected for a first external device at a location closest to the first connector on a first power line of the first FPCB through the first feedback line with a second feedback voltage detected for a second external device at a location closest to the second connector on a second power line of the second FPCB through the second feedback line, and
transmit, to the control circuit, a lower feedback voltage of the first feedback voltage and the second feedback voltage.

10. The electronic device of claim 9,
wherein the control circuit is further configured to:
supply a first voltage to the external device through boosting of the supply voltage in response to the low feedback voltage, and
supply second voltage to the external device through at least one of adjustment of an amount of boosting or drop of an amount of the supply voltage boosted based on the low feedback voltage in response to a high feedback voltage after voltage boosting, and
wherein the second voltage comprises a voltage lower than the first voltage.

11. The electronic device of claim 9, wherein the control circuit is further configured to:
check feedback on a compensated voltage based on at least one of the first feedback voltage or the second feedback voltage for the first external device or the second external device, and
drop the compensated voltage when the compensated voltage is higher than a given voltage of any one external device.

12. The electronic device of claim 9, wherein the control circuit is further configured to boost a voltage output to the external device when a voltage less than a given reference voltage is detected based on the feedback on the supply voltage.

* * * * *